US011985839B2

(12) United States Patent
Yoon et al.

(10) Patent No.: US 11,985,839 B2
(45) Date of Patent: May 14, 2024

(54) ORGANIC LIGHT-EMITTING DEVICE

(71) Applicant: Samsung Display Co., Ltd., Yongin-si (KR)

(72) Inventors: Seokgyu Yoon, Yongin-si (KR); Hyosup Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 629 days.

(21) Appl. No.: 17/250,461

(22) PCT Filed: Nov. 29, 2018

(86) PCT No.: PCT/KR2018/015012
§ 371 (c)(1),
(2) Date: Jan. 25, 2021

(87) PCT Pub. No.: WO2020/022580
PCT Pub. Date: Jan. 30, 2020

(65) Prior Publication Data
US 2021/0288279 A1 Sep. 16, 2021

(30) Foreign Application Priority Data
Jul. 23, 2018 (KR) .................. 10-2018-0085381

(51) Int. Cl.
H10K 50/15 (2023.01)
C09K 11/06 (2006.01)
(Continued)

(52) U.S. Cl.
CPC ............. *H10K 50/15* (2023.02); *C09K 11/06* (2013.01); *H10K 30/865* (2023.02); *H10K 50/11* (2023.02);
(Continued)

(58) Field of Classification Search
CPC ...... H10K 50/15; H10K 50/156; H10K 50/16; H10K 50/166; H10K 50/18; H10K 50/181
See application file for complete search history.

(56) References Cited

U.S. PATENT DOCUMENTS 8,049,408 B2 11/2011 Smith et al.
8,415,874 B2 4/2013 Song et al.
(Continued)

FOREIGN PATENT DOCUMENTS

CN 1703937 A 11/2005
CN 102290531 A 12/2011
(Continued)

OTHER PUBLICATIONS

H. Ahn et al., "Highly Efficient Electron Injection Layer of LiF/Yb Bilayer for Top-emitting Organic Light Emitting Diodes," SID 2012 Digest, pp. 1481-1483. (Year: 2012).*
(Continued)

*Primary Examiner* — Peter M Albrecht
(74) *Attorney, Agent, or Firm* — Lewis Roca Rothgerber Christie LLP

(57) ABSTRACT

An organic light-emitting device may include: an anode; a cathode; an organic layer between the anode and the cathode and including an emission layer; and a first exciton quenching layer between the anode and the emission layer and in direct contact with the emission layer. The emission layer may include a host and a dopant, the first exciton quenching layer may include a first quenching material, and the host, the dopant, and the first quenching material may each satisfy Equations 1-1 and 1-2:

$T1(Q1) \leq T1(H)$   Equation 1-1

$T1(Q1) \leq T1(D)$   Equation 1-2

(Continued)

wherein, in Equations 1-1 and 1-2, T1(Q1) indicates a lowest excited triplet energy level of the first quenching material, T1(H) indicates a lowest excited triplet energy level of the host, and T1(D) indicates a lowest excited triplet energy level of the dopant.

20 Claims, 1 Drawing Sheet

(51) Int. Cl.
*H10K 30/80* (2023.01)
*H10K 50/11* (2023.01)
*H10K 50/16* (2023.01)
*H10K 50/17* (2023.01)
*H10K 50/18* (2023.01)
*H10K 85/60* (2023.01)
*H10K 101/00* (2023.01)
*H10K 101/10* (2023.01)

(52) U.S. Cl.
CPC .......... *H10K 50/16* (2023.02); *H10K 50/171* (2023.02); *H10K 50/18* (2023.02); *H10K 85/633* (2023.02); *H10K 85/6572* (2023.02); *H10K 85/6574* (2023.02); *C09K 2211/1007* (2013.01); *C09K 2211/1018* (2013.01); *H10K 2101/10* (2023.02); *H10K 2101/90* (2023.02)

(56) References Cited

U.S. PATENT DOCUMENTS

| | | | |
|---|---|---|---|
| 8,623,524 | B2 | 1/2014 | Arakane et al. |
| 8,778,511 | B2 | 7/2014 | Adamovich et al. |
| 8,993,129 | B2 | 3/2015 | Endo et al. |
| 9,385,335 | B2 | 7/2016 | Pflumm et al. |
| 9,543,538 | B2 | 1/2017 | Kim et al. |
| 9,917,270 | B1 | 3/2018 | Volz et al. |
| 10,109,815 | B2 | 10/2018 | Adamovich et al. |
| 10,741,772 | B2 | 8/2020 | Lee et al. |
| 2006/0194076 | A1 | 8/2006 | Nariyuki |
| 2006/0220011 | A1* | 10/2006 | Kitamura ............. H10K 50/166 257/40 |
| 2012/0199825 | A1 | 8/2012 | Soga et al. |
| 2013/0105777 | A1 | 5/2013 | Adamovich et al. |
| 2017/0179418 | A1 | 6/2017 | Lee |

FOREIGN PATENT DOCUMENTS

| | | |
|---|---|---|
| JP | 2006-270053 A | 10/2006 |
| JP | 2008-509537 A | 3/2008 |
| JP | 2012-4116 A | 1/2012 |
| JP | 2012-28726 A | 2/2012 |
| JP | 2012-511833 A | 5/2012 |
| JP | 2016-51901 A | 4/2016 |
| KR | 10-1016164 B1 | 2/2011 |
| KR | 10-2013-0048170 A | 5/2013 |
| KR | 10-2014-0027218 A | 3/2014 |
| KR | 10-2015-0086095 A | 7/2015 |
| KR | 10-1736661 B1 | 5/2017 |
| KR | 10-2017-0072728 A | 6/2017 |

OTHER PUBLICATIONS

International Search Report for corresponding Application No. PCT/KR2018/015012 dated Apr. 19, 2019, 6 pp.

* cited by examiner

ORGANIC LIGHT-EMITTING DEVICE

CROSS-REFERENCE TO RELATED APPLICATIONS

This application is a U.S. National Phase Patent Application of International Application No. PCT/KR2018/015012, filed Nov. 29, 2018, which claims priority to Korean Patent Application No. 10-2018-0085381, filed Jul. 23, 2018, the entire content of all of which is incorporated herein by reference.

TECHNICAL FIELD

One or more embodiments relate to an organic light-emitting device.

BACKGROUND ART

Organic light-emitting devices (OLEDs) are self-emissive devices that, as compared with devices of the related art, have wide viewing angles, high contrast ratios, short response times, and excellent characteristics in terms of brightness, driving voltage, and response speed, and produce full-color images.

OLEDs may include a first electrode on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transit from an excited state to a ground state to thereby generate light.

DESCRIPTION OF EMBODIMENTS

Technical Problem

One or more embodiments include an organic light-emitting device including an exciton quenching layer.

Technical Solution to Problem

According to an embodiment, an organic light-emitting device may include: an anode; a cathode; an organic layer located between the anode and the cathode and including an emission layer; and a first exciton quenching layer located between the anode and the emission layer and in direct contact with the emission layer, wherein the emission layer may include a host and a dopant, the first exciton quenching layer may include a first quenching material, and the host, the dopant, and the first quenching material may each satisfy Equations 1-1 and 1-2:

$$T1(Q1) \leq T1(H) \qquad \text{Equation 1-1}$$

$$T1(Q1) \leq T1(D) \qquad \text{Equation 1-2}$$

wherein, in Equations 1-1 and 1-2,

T1(Q1) indicates a lowest excited triplet energy level of the first quenching material, T1(H) indicates a lowest excited triplet energy level of the host, and T1(D) indicates a lowest excited triplet energy level of the dopant.

According to one or more embodiments, the first exciton quenching layer may further include a first base material.

According to one or more embodiments, a thickness of the emission layer ($D_E$) and a thickness of the first exciton quenching layer ($D_{Q1}$) satisfy $D_E \geq D_{Q1}$.

According to one or more embodiments, the dopant may emit delayed fluorescence or fluorescence.

According to one or more embodiments, the host may include a first host and a second host.

According to one or more embodiments, the first host may be a hole transporting host not including an electron transporting moiety, and the second host may be an electron transporting host including at least one electron transporting moiety.

According to one or more embodiments, the organic light-emitting device may further include an electron injection layer between the emission layer and the cathode, wherein a work function of the electron injection layer may be less than 3.0 electron volts (eV).

According to one or more embodiments, the electron injection layer may include a rare earth metal.

According to one or more embodiments, the electron injection layer may include ytterbium (Yb).

According to one or more embodiments, the organic layer may include: a hole transport layer between the anode and the first exciton quenching layer, wherein the first exciton quenching layer may be in direct contact with the hole transport layer.

According to one or more embodiments, the hole transport layer may include a hole transporting material, and the first base material may be identical to the hole transporting material.

According to one or more embodiments, the organic layer may include: a hole transport layer between the anode and the first exciton quenching layer; and an electron blocking layer between the hole transport layer and the first exciton quenching layer, wherein the first exciton quenching layer may be in direct contact with the electron blocking layer, and the electron blocking layer may be in direct contact with the hole transport layer.

According to one or more embodiments, the hole transport layer may include a hole transporting material, the electron blocking layer may include an electron blocking material, and the first base material may be identical to the hole transporting material and/or the electron blocking material.

According to one or more embodiments, the organic light-emitting device may further include a second exciton quenching layer located between the cathode and the emission layer and in direct contact with the emission layer, wherein the second exciton quenching layer may include a second quenching material, and the host, the dopant, and the second quenching material may each satisfy Equations 2-1 and 2-2:

$$T1(Q2) \leq T1(H) \qquad \text{Equation 2-1}$$

$$T1(Q2) \leq T1(D) \qquad \text{Equation 2-2}$$

wherein, in Equations 2-1 and 2-2,

T1(Q2) indicates a lowest excited triplet energy level of the second quenching material, T1(H) indicates a lowest excited triplet energy level of the host, and T1(D) indicates a lowest excited triplet energy level of the dopant.

According to one or more embodiments, the second exciton quenching layer may further include a second base material.

According to one or more embodiments, a thickness of the emission layer($D_E$) and a thickness of the second exciton quenching layer($D_{Q2}$) satisfy $D_E \geq D_{Q2}$.

According to one or more embodiments, the organic layer may include: an electron transport layer between the cathode and the second exciton quenching layer, wherein the second exciton quenching layer may be in direct contact with the electron transport layer.

According to one or more embodiments, the electron transport layer may include an electron transporting material, and the second base material may be identical to the electron transporting material.

According to one or more embodiments, the organic layer may include: an electron transport layer between the cathode and the second exciton quenching layer; and a hole blocking layer between the electron transport layer and the second exciton quenching layer, wherein the second exciton quenching layer may be in direct contact with the hole blocking layer, and the hole blocking layer may be in direct contact with the electron transport layer.

According to one or more embodiments, the electron transport layer may include an electron transporting material, the hole blocking layer may include a hole blocking material, and the second base material may be identical to the electron transporting material and/or the hole blocking material.

Advantageous Effects of Disclosure

An organic light-emitting device including the exciton quenching layer may have improved lifespan.

MODE OF DISCLOSURE

Figure 1:
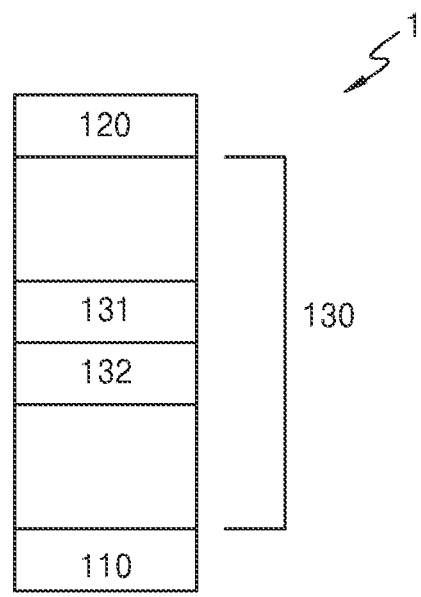
FIG. 1 illustrates a schematic cross-sectional view of an embodiment of an organic light-emitting device.

As the inventive concept allows for various changes and numerous embodiments, particular embodiments will be illustrated in the drawings and described in detail in the written description. Effects, features, and a method of achieving the inventive concept will be obvious by referring to example embodiments of the inventive concept with reference to the attached drawings. The inventive concept may, however, be embodied in many different forms and should not be construed as being limited to the embodiments set forth herein.

Hereinafter, the inventive concept will be described in detail by explaining example embodiments of the inventive concept with reference to the attached drawings. Like reference numerals in the drawings denote like elements, and thus their description will be omitted.

In the embodiments described in the present specification, an expression used in the singular encompasses the expression of the plural, unless it has a clearly different meaning in the context.

In the present specification, it is to be understood that the terms such as "including," "having," and "comprising" are intended to indicate the existence of the features or components disclosed in the specification, and are not intended to preclude the possibility that one or more other features or components may exist or may be added.

It will be understood that when a layer, region, or component is referred to as being "on" or "onto" another layer, region, or component, it may be directly or indirectly formed over the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

The "lowest excited triplet energy level" as used herein was measured as follows: a mixture (each compound was dissolved in an amount of 1 milligram (mg) in 3 milliliters (mL) of toluene) of toluene and each compound was loaded into a quartz cell. Subsequently, the resultant quartz cell was loaded into liquid nitrogen (77 Kelvins (K)), a photoluminescence spectrum thereof was measured by using a device for measuring photoluminescence. The obtained spectrum was compared with a photoluminescence spectrum measured at room temperature, and peaks observed only at the lower temperature were analyzed to calculate $T_1$ energy levels.

The "work function" as used herein was measured as follows: a potential (Volts, V) versus current (Amperes, A) graph of each compound was obtained by using cyclic voltammetry (CV) (electrolyte: 0.1 molar (M) $Bu_4NClO_4$/solvent: $CH_2Cl_2$/electrode: 3-electrode system (working electrode: GC, reference electrode: Ag/AgCl, auxiliary electrode: Pt)). Subsequently, from reduction onset of the graph, a work function of the compound was calculated.

The term "organic layer" as used herein refers to a single and/or a plurality of layers between an anode and a cathode in an organic light-emitting device. A material included in the "organic layer" is not limited to an organic material.

As used herein, the expression the "(organic layer) includes a compound represented by Formula 1" may be construed as meaning the "(organic layer) may include one compound that is represented by Formula 1 or two different compounds that are represented by Formula 1".

The inventive concept will now be described more fully with reference to the accompanying drawings, in which exemplary embodiments of the inventive concept are shown.

FIG. 1 is a schematic view of an organic light-emitting device 1 according to an embodiment.

As shown in FIG. 1, the organic light-emitting device 1 may include an anode 110; a cathode 120; an organic layer 130 between the anode 110 and the cathode 120 and including an emission layer 131; and a first exciton quenching layer 132 between the anode 110 and the emission layer 131 and in direct contact with the emission layer 131, wherein the emission layer 131 may include a host and a dopant, the first exciton quenching layer 132 may include a first quenching material, and the host, the dopant, and the first quenching material may each satisfy Equations 1-1 and 1-2:

$$T1(Q1) \leq T1(H) \qquad \text{Equation 1-1}$$

$$T1(Q1) \leq T1(D) \qquad \text{Equation 1-2}$$

wherein, in Equations 1-1 and 1-2,

T1(Q1) indicates a lowest excited triplet energy level of the first quenching material, T1(H) indicates a lowest excited triplet energy level of the host, and T1(D) indicates a lowest excited triplet energy level of the dopant.

In the organic light-emitting device that satisfies Equation 1-1, some of triplets generated from the host in the emission layer may be transferred to the first exciton quenching layer. Accordingly, the triplet concentration in the emission layer may be properly controlled, and the lifespan of the organic light-emitting device may be improved by lowering the concentration of triplets present in the emission layer and not participating in emission.

In the organic light-emitting device that satisfies Equation 1-2, all triplets generated from the host in the emission layer do not move to the first exciton quenching layer (e.g., not all triplets generated from the host in the emission layer move to the first exciton quenching layer), and triplets may also move to the dopant in the emission layer. Accordingly, the triplet concentration in the emission layer may be maintained to an extent that the desired luminescence efficiency may be obtained.

To obtain the above-described effect, the emission layer and the first exciton quenching layer may essentially be in direct contact, and no other layer may be interposed between the emission layer and the first exciton quenching layer.

In particular, the host, the dopant, and the first quenching material may further satisfy Equation 1-11 and/or 1-21, but embodiments are not limited thereto:

$$0.1 \text{ eV} \leq T1(H) - T1(Q1) \leq 1.0 \text{ eV} \quad \text{Equation 1-11}$$

$$0.1 \text{ eV} \leq T1(D) - T1(Q1) \leq 1.0 \text{ eV} \quad \text{Equation 1-21}$$

wherein, in Equations 1-11 and 1-21,

T1(Q1) indicates a lowest excited triplet energy level of the first quenching material, T1(H) indicates a lowest excited triplet energy level of the host, and T1(D) indicates a lowest excited triplet energy level of the dopant.

In the organic light-emitting device that further satisfies Equation 1-11, as the ratio of triplets that move from the host to the first exciton quenching layer to triplets that move from the host to the dopant is properly controlled, efficiency and lifespan thereof may be improved simultaneously.

In the organic light-emitting device that further satisfies Equation 1-21, as the ratio of triplets that move from the host to the dopant is properly controlled, efficiency thereof may be further improved.

The anode 110 may be formed by depositing or sputtering a material for forming the anode 110 on the substrate. The anode 110 may be selected from materials with a high work function for easy hole injection.

The anode 110 may be a reflective electrode, a semi-transmissive electrode, or a transmissive electrode. When forming a transmissive electrode, a material for forming the anode 110 may be selected from indium tin oxide (ITO), indium zinc oxide (IZO), tin oxide ($SnO_2$), zinc oxide (ZnO), and any combinations thereof, but embodiments are not limited thereto. In some embodiments, when forming a semi-transmissive electrode or a reflective electrode, as a material for forming the anode, at least one selected from magnesium (Mg), silver (Ag), aluminum (Al), aluminum-lithium (Al—Li), calcium (Ca), magnesium-indium (Mg—In), magnesium-silver (Mg—Ag), and any combination thereof may be used, but embodiments are not limited thereto.

The anode 110 may have a single-layered structure, or a multi-layered structure including two or more layers. For example, the anode 110 may have a triple-layer structure of ITO/Ag/ITO, but embodiments are not limited thereto.

The organic layer 130 may be on the anode 110. As described, the organic layer 130 may include the emission layer 131 and the first exciton quenching layer 132. The organic layer 130 may further include a hole transport region (not shown) between the anode 110 and the emission layer 131 and an electron transport region (not shown) between the emission layer 131 and the cathode 120.

The hole transport region may have i) a single-layered structure consisting of a single layer consisting of a single material, ii) a single-layered structure consisting of a single layer including a plurality of different materials, or iii) a multi-layered structure having a plurality of layers including a plurality of different materials.

The hole transport region may include at least one selected from a hole injection layer, a hole transport layer, an emission auxiliary layer, and an electron blocking layer.

For example, the hole transport region may have a single-layered structure including a single layer including a plurality of different materials or a multi-layered structure, e.g., a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein layers of each structure are sequentially stacked on the anode 110 in each stated order, but embodiments are not limited thereto.

The hole transport region may include at least one selected from m-MTDATA, TDATA, 2-TNATA, NPB (NPD), β-NPB, TPD, a spiro-TPD, a spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), CzSi, TCTA, a compound represented by Formula 201, and a compound represented by Formula 202:

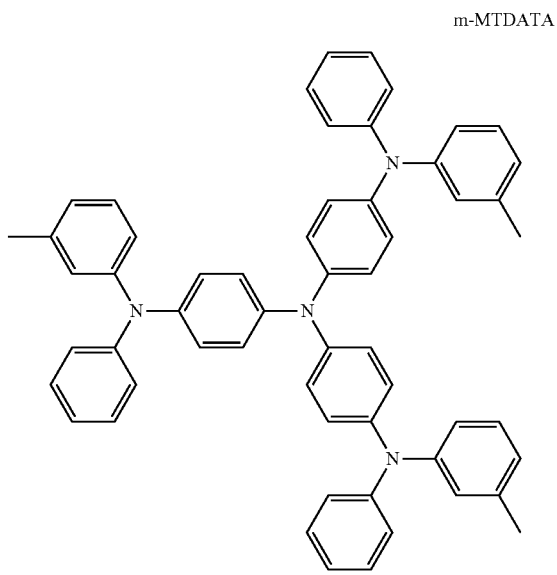

m-MTDATA

TDATA
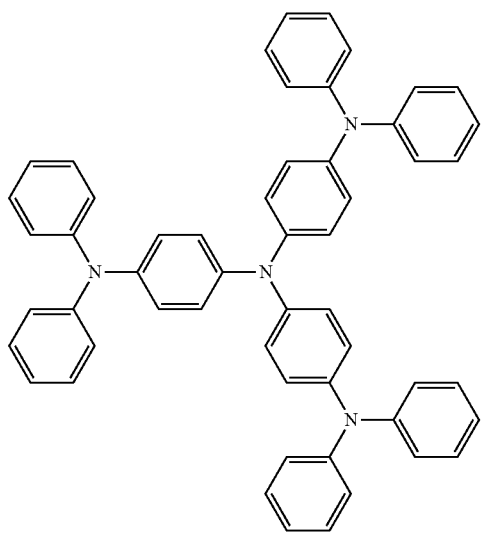
2-TNATA
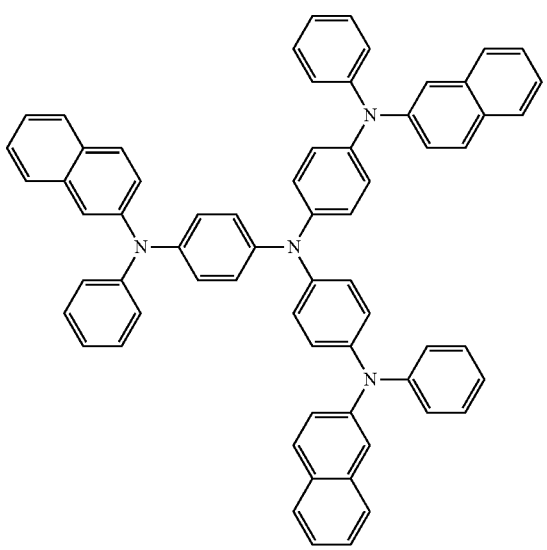
NPB
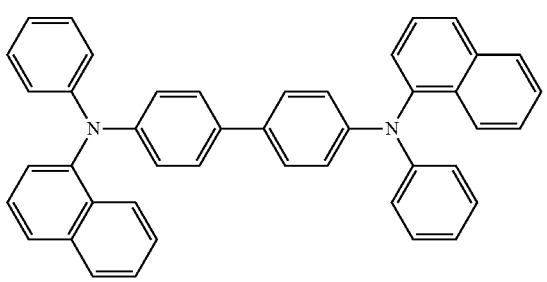
β-NPB
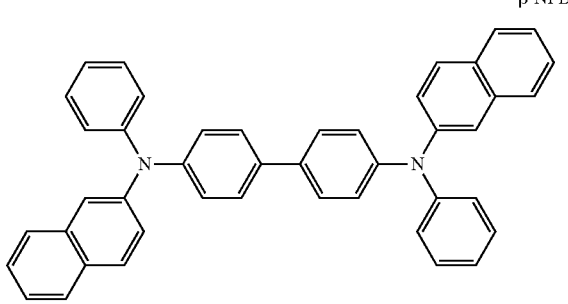
TPD
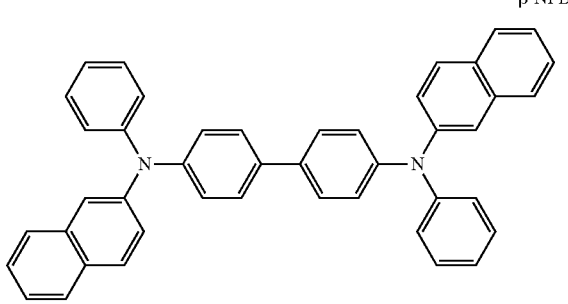
Spiro-TPD
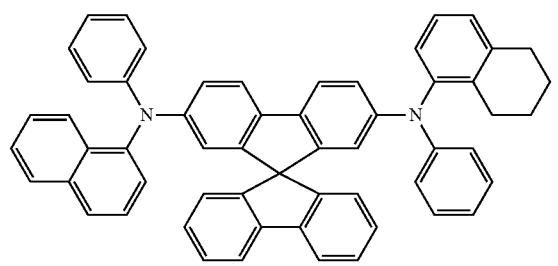
Spiro-NPB
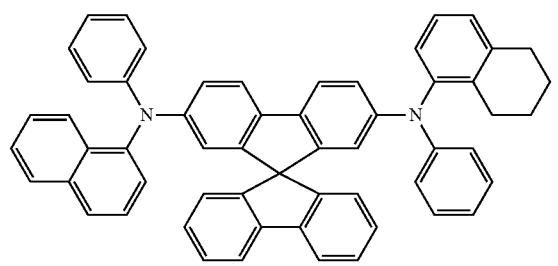
methylated NPB
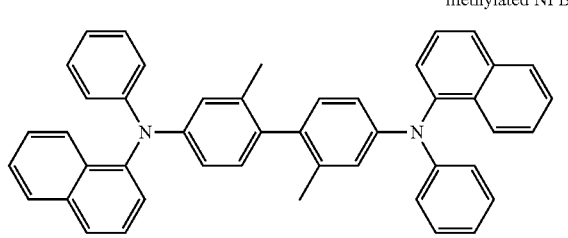

TAPC

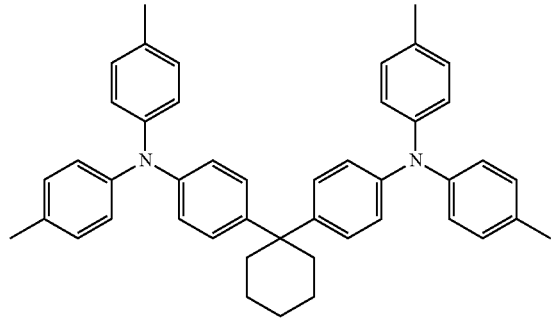

HMTPD

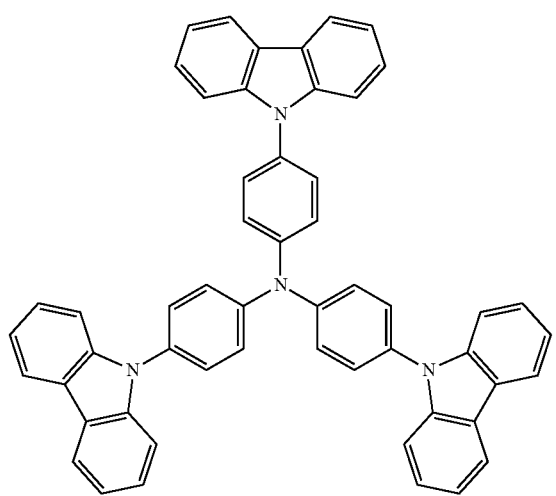

TCTA

CzSi

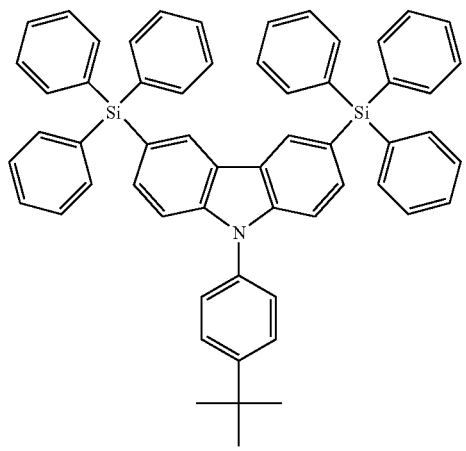

$$R_{201}-(L_{201})_{xa1}-N \begin{matrix} (L_{202})_{xa2}-R_{202} \\ (L_{203})_{xa3}-R_{203} \end{matrix} \quad \text{Formula 201}$$

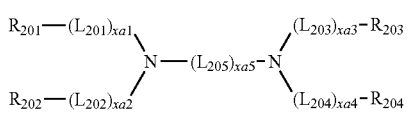

Formula 202 wherein, in Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)—*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer from 0 to 3, xa5 may be an integer from 1 to 10, and $R_{201}$ to $R_{204}$ and Q201 may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In some embodiments, in Formula 202, $R_{201}$ and $R_{202}$ may optionally be bound via a single bond, a dimethyl-methylene group, or a diphenyl-methylene group, and $R_{203}$ and $R_{204}$ may optionally be bound via a single bond, a dimethyl-methylene group, or a diphenyl-methylene group.

In some embodiments, in Formulae 201 and 202, $L_{201}$ to $L_{205}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In some embodiments, xa1 to xa4 may each independently be 0, 1, or 2.

In some embodiments, xa5 may be 1, 2, 3, or 4.

In some embodiments, $R_{201}$ to $R_{204}$ and $Q_{201}$ may each independently be selected from a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein $Q_{31}$ to $Q_{33}$ may respectively be understood by referring to the descriptions of $Q_{31}$ to $Q_{33}$ provided herein.

In some embodiments, in Formula 201, at least one selected from $R_{201}$ to $R_{203}$ may each independently be selected from:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments are not limited thereto.

In some embodiments, in Formula 202, i) $R_{201}$ and $R_{202}$ may be bound via a single bond, and/or ii) $R_{203}$ and $R_{204}$ may be bound via a single bond.

In some embodiments, in Formula 202, at least one selected from $R_{201}$ to $R_{204}$ may be selected from:

a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments are not limited thereto.

The compound represented by Formula 201 may be represented by Formula 201A:

Formula 201A

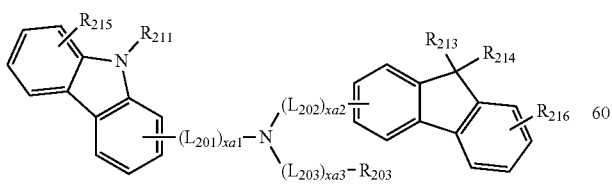

In some embodiments, the compound represented by Formula 201 may be represented by Formula 201A(1), but embodiments are not limited thereto:

Formula 201A(1)

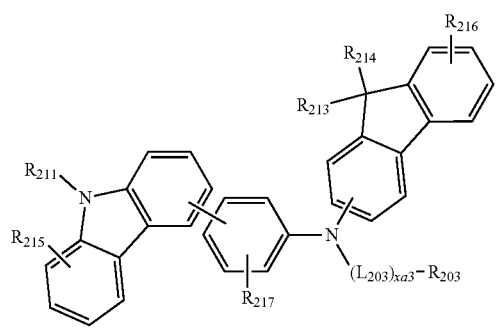

In some embodiments, the compound represented by Formula 201 may be represented by Formula 201A-1, but embodiments are not limited thereto:

Formula 201A-1

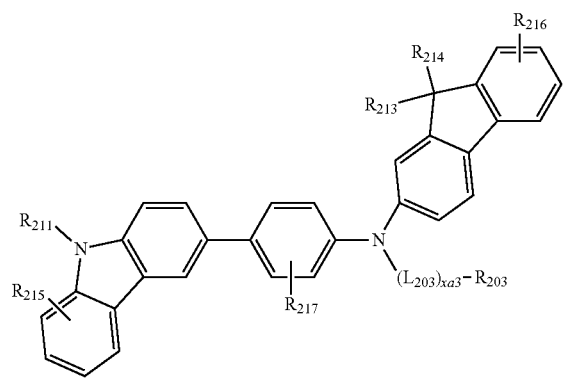

In some embodiments, the compound represented by Formula 202 may be represented by Formula 202A:

Formula 202A

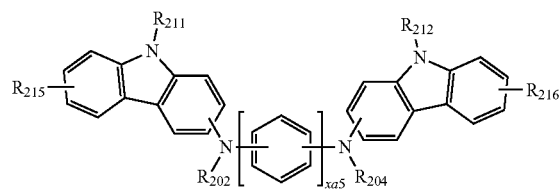

In some embodiments, the compound represented by Formula 202 may be represented by Formula 202A-1:

Formula 202A-1

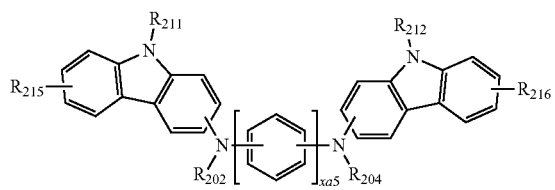

In Formulae 201A, 201A(1), 201A-1, 202A, and 202A-1, $L_{201}$ to $L_{203}$, xa1 to xa3, xa5, and $R_{202}$ to $R_{204}$ may respectively be understood by referring to the descriptions of $L_{201}$ to $L_{203}$, xa1 to xa3, xa5, and $R_{202}$ to $R_{204}$ provided herein, $R_{211}$ and $R_{212}$ may each be understood by referring to the description of $R_{203}$ provided herein, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from Compounds HT1 to HT39, but embodiments are not limited thereto:

HT1

HT2

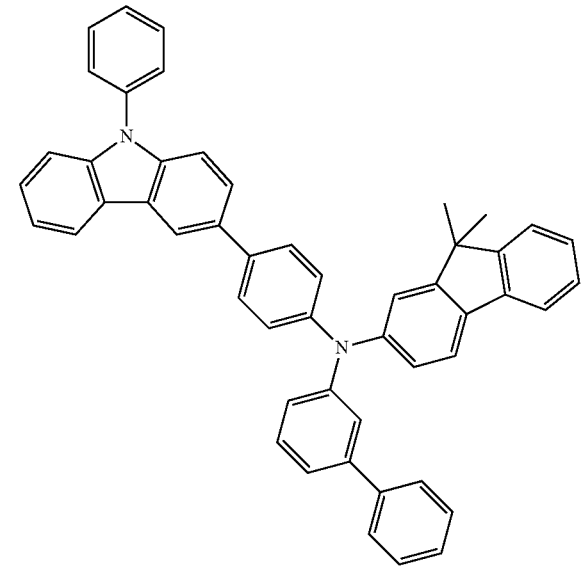

HT3

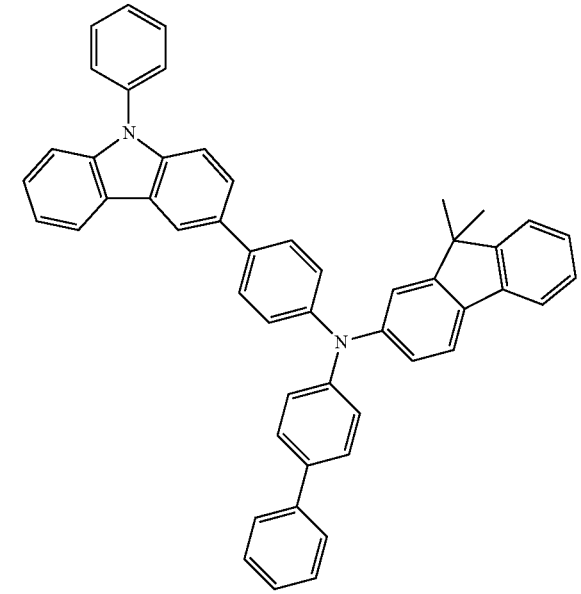

HT4
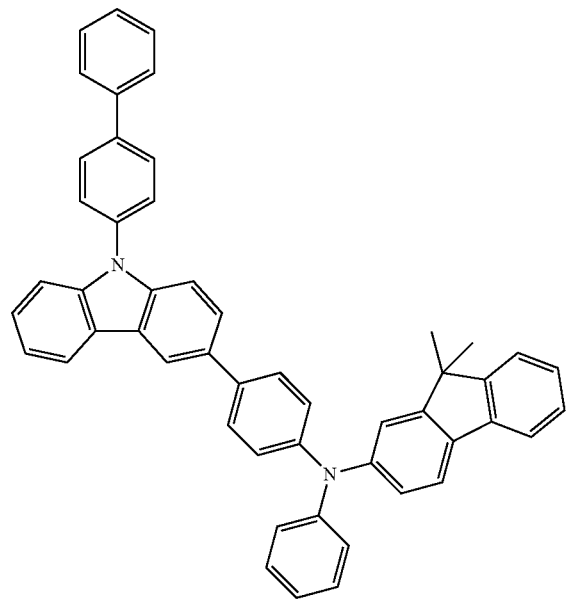
HT5
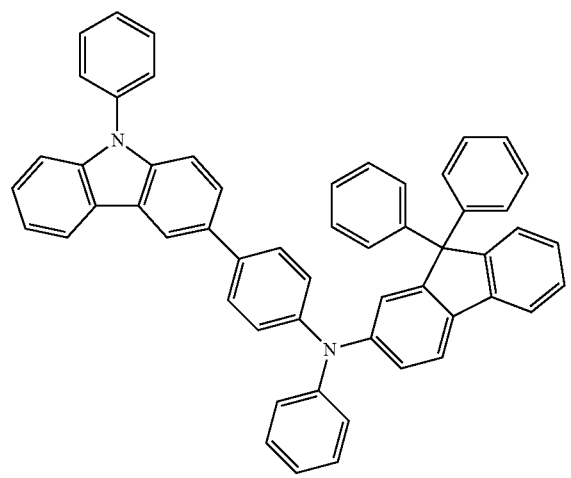
HT6
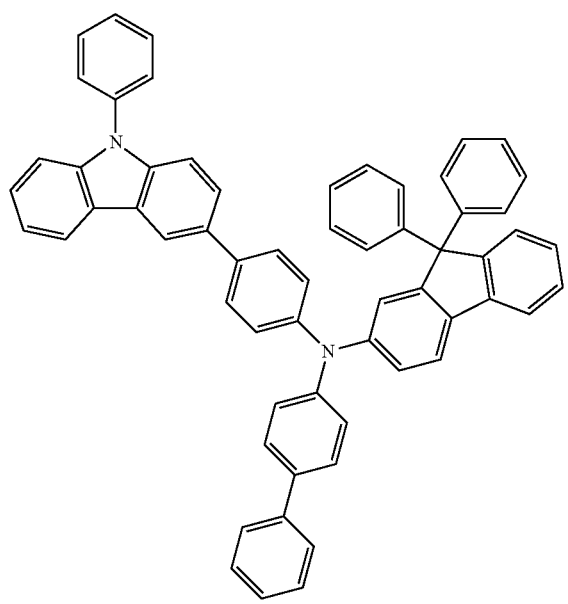
HT7
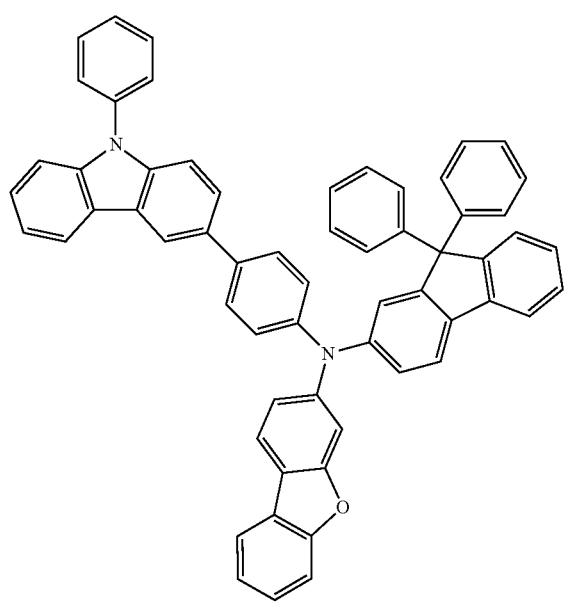

HT8
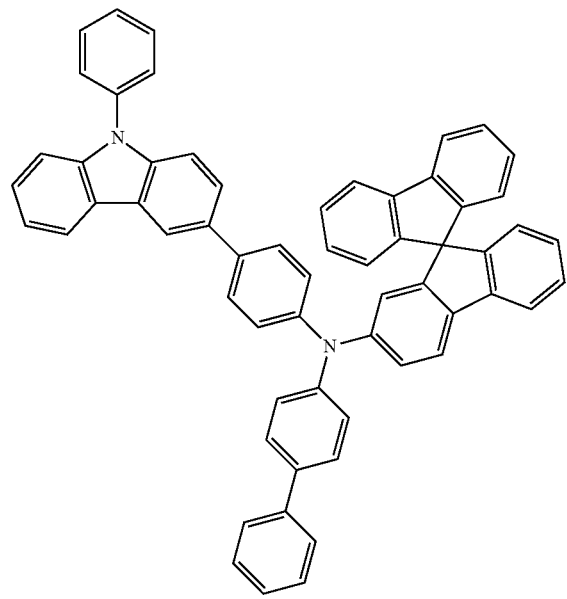
HT9
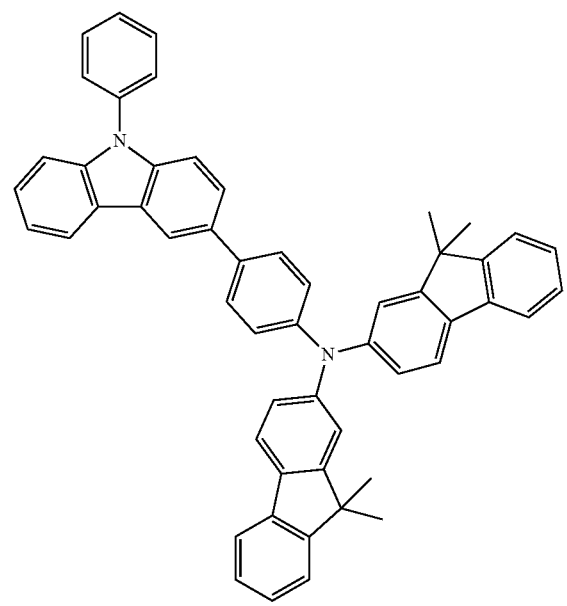
HT10
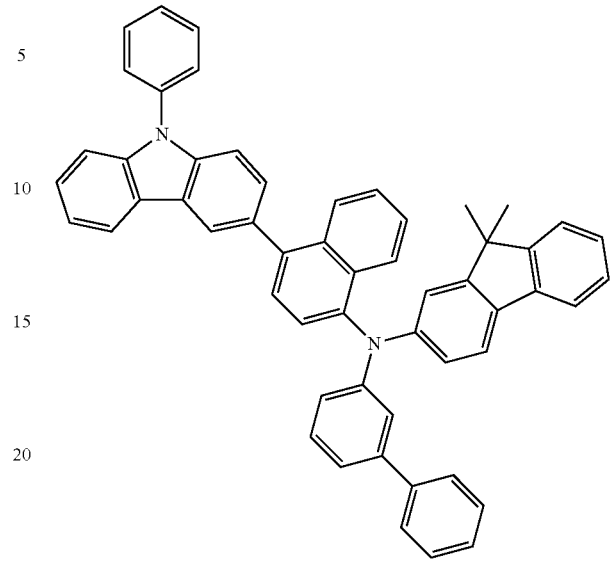
HT11
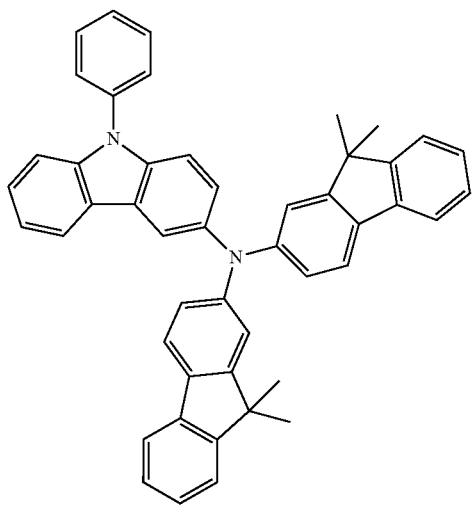
HT12
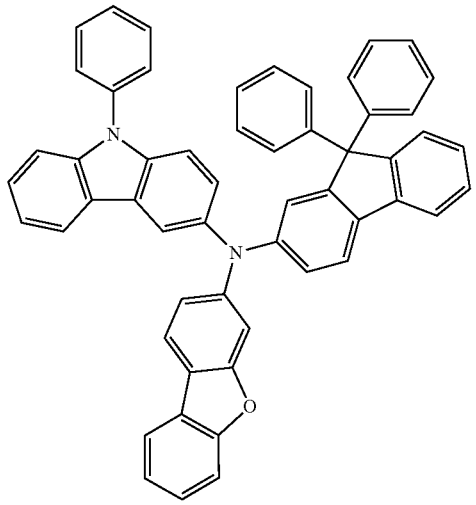

HT13
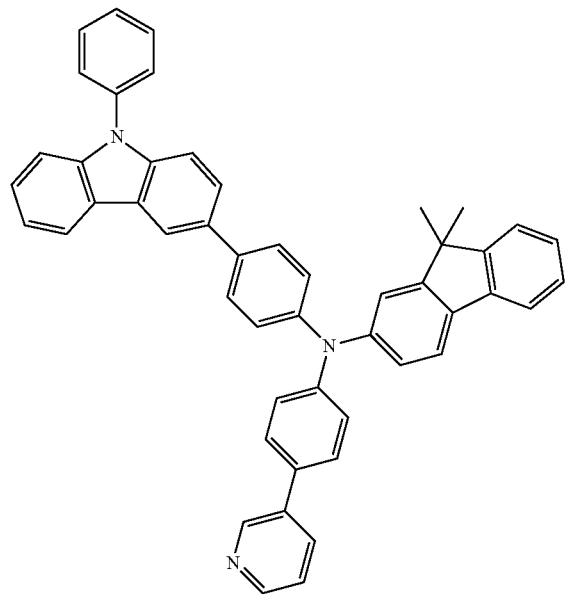
HT14
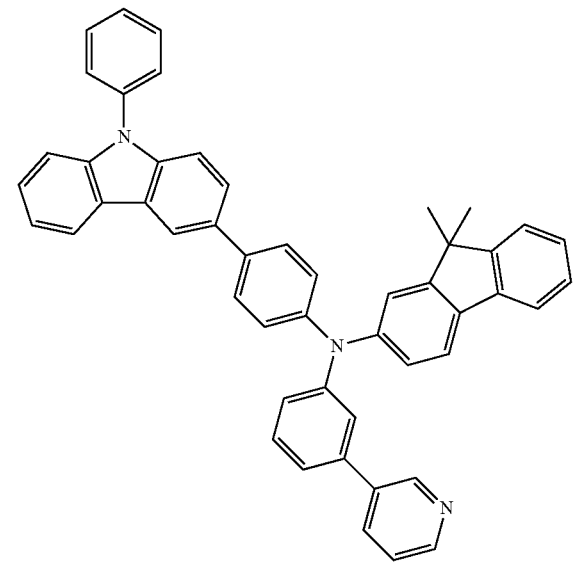
HT15
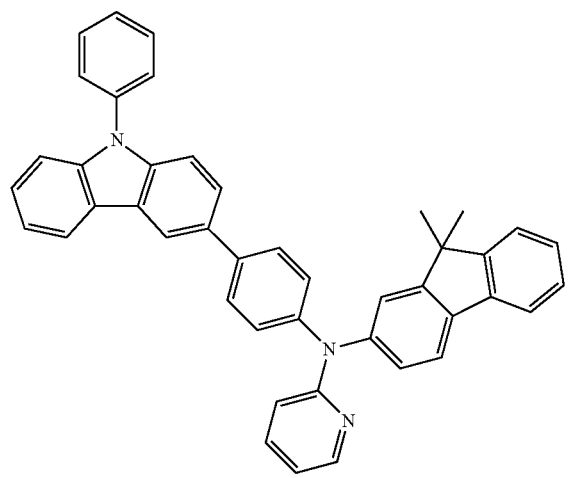
HT16
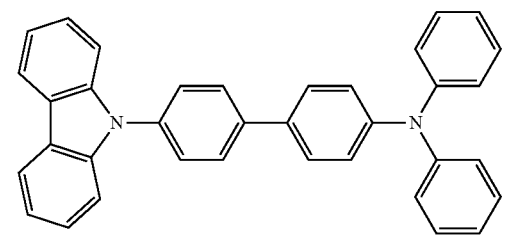
HT17
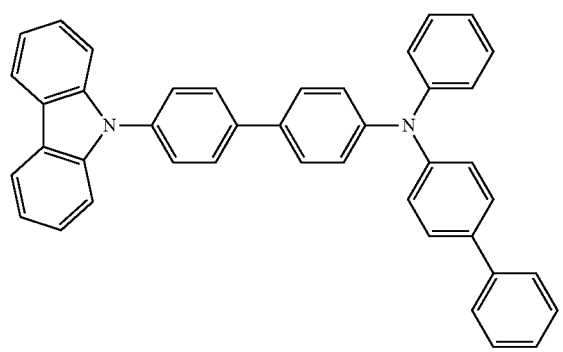
HT18
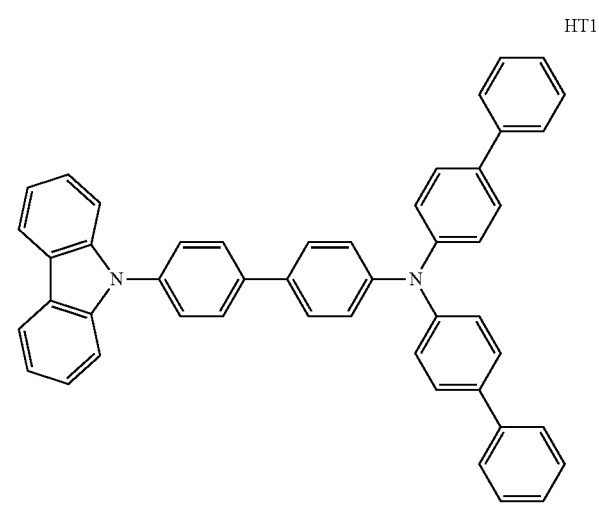

-continued
HT19
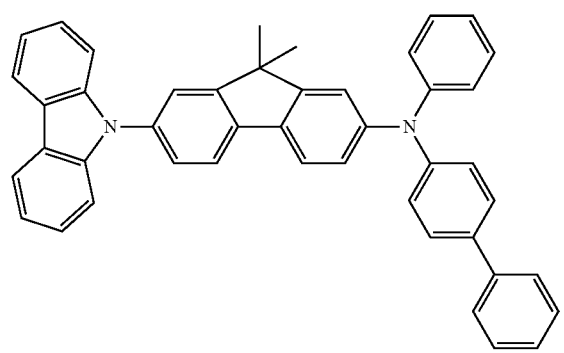
HT20
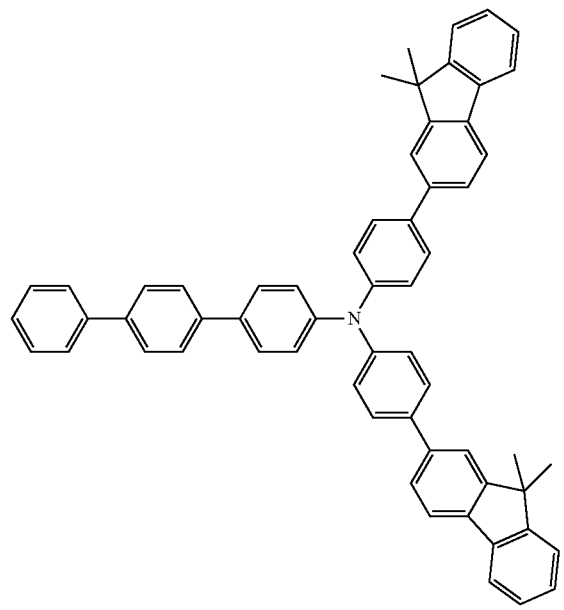
HT21
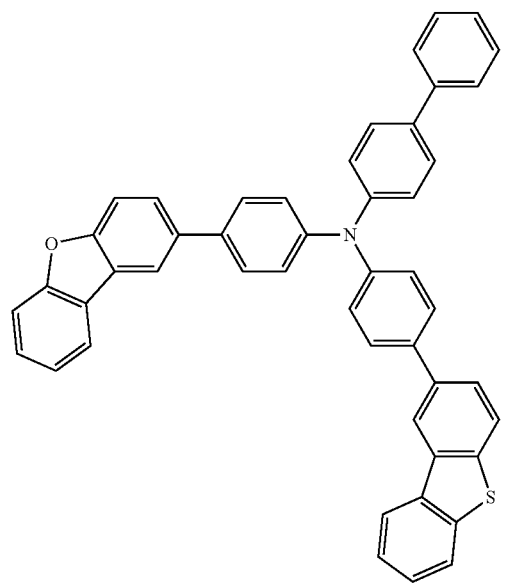
HT22
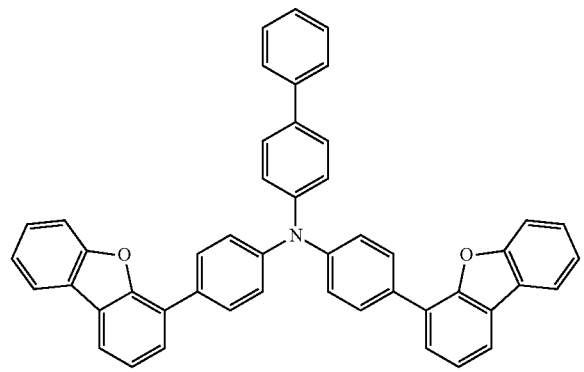

HT23
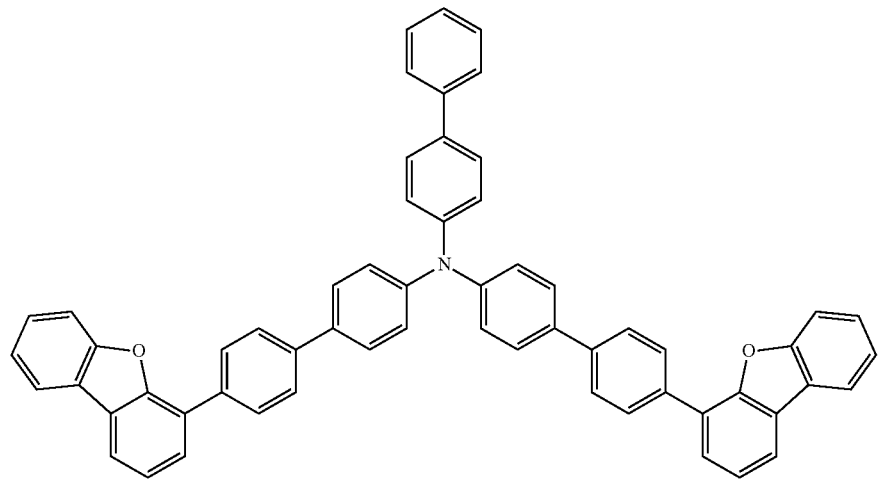
HT24
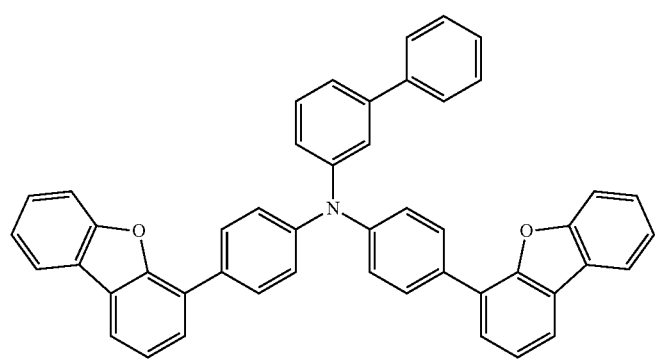
HT25
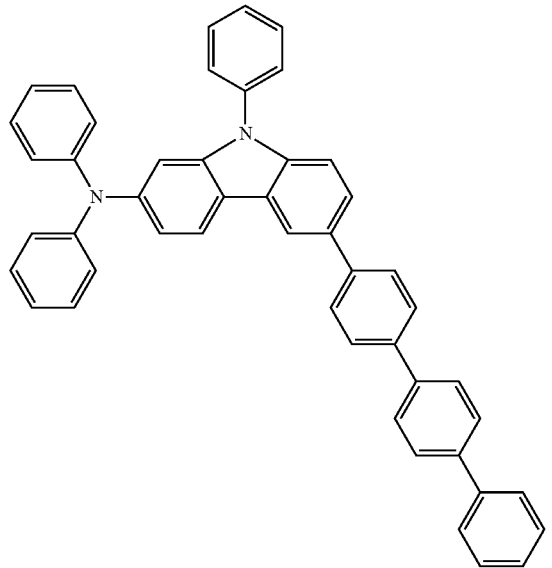
HT26
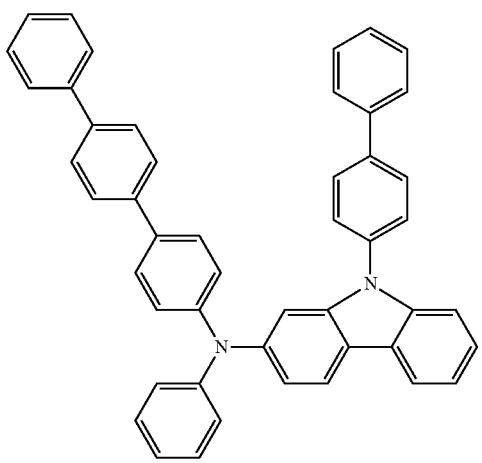

-continued
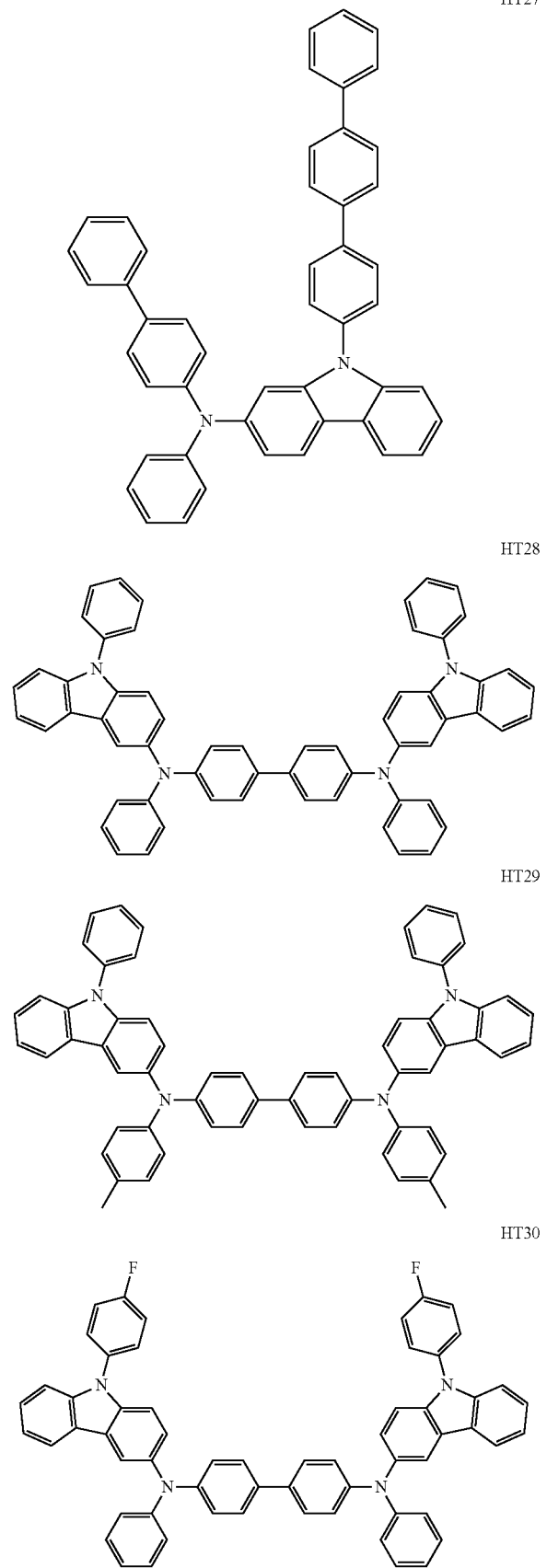
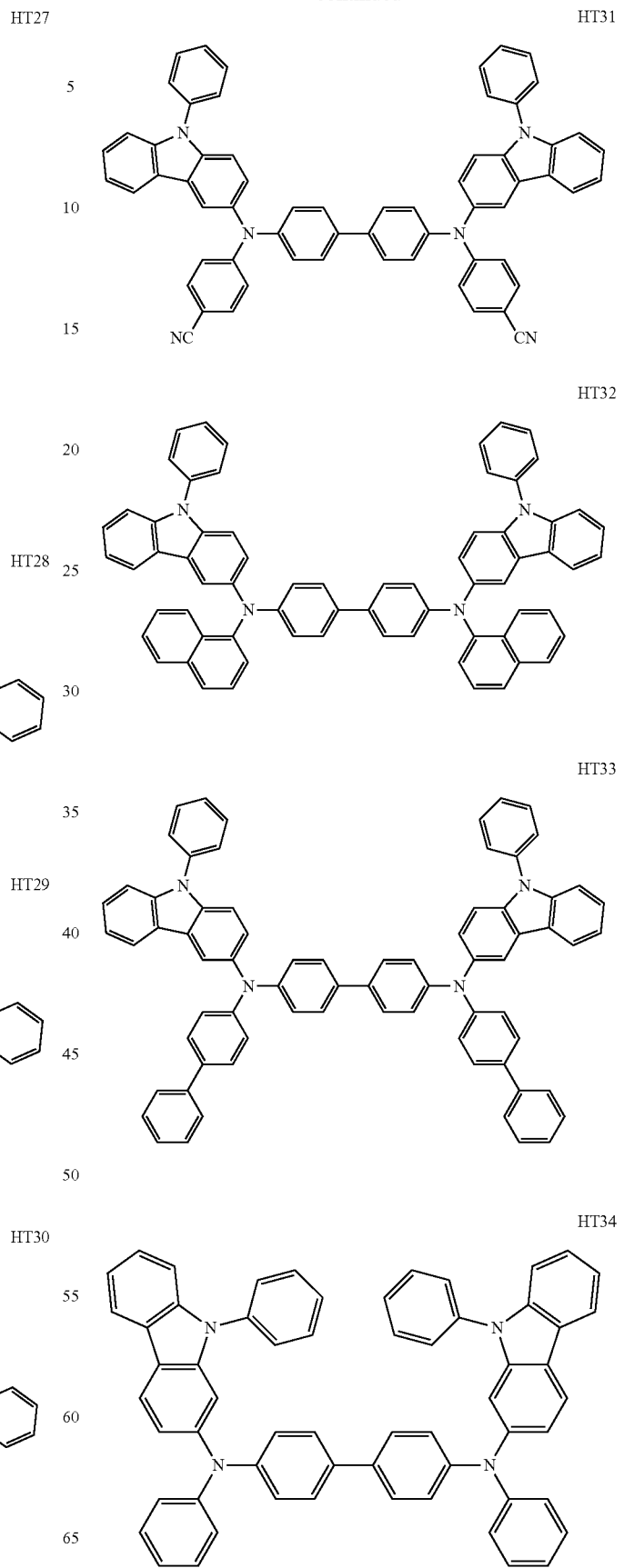

HT35

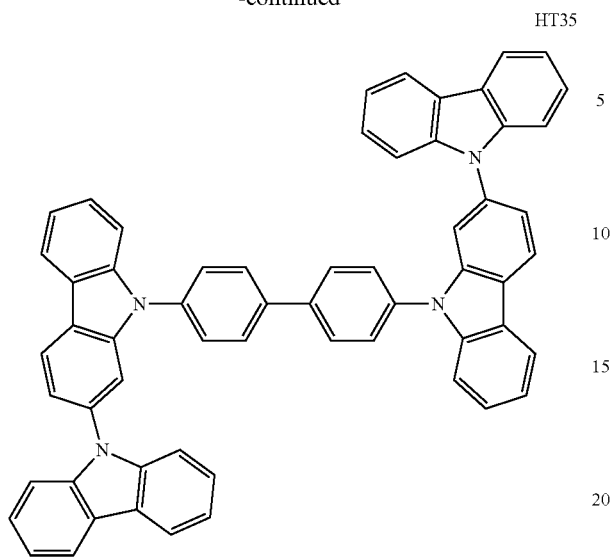

HT36

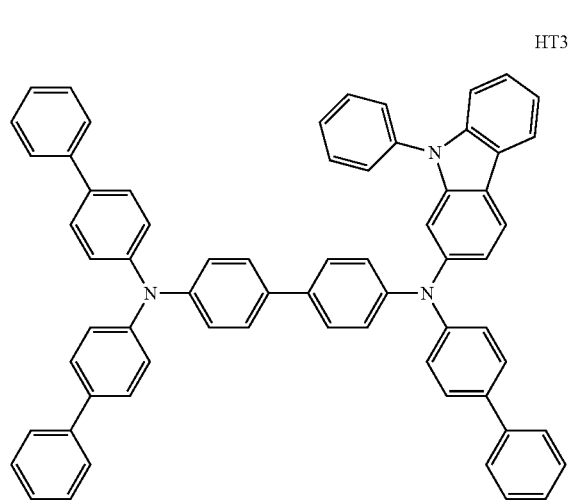

HT37

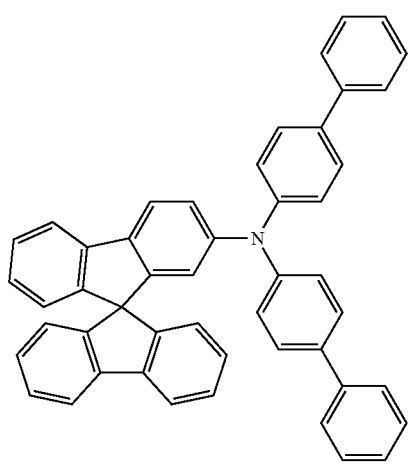

HT38

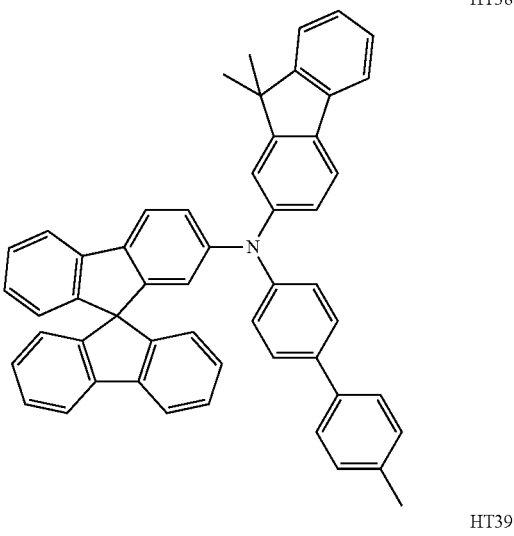

HT39

The thickness of the hole transport region may be in a range of about 100 (Angstroms) Å to about 10,000 Å, and in some embodiments, about 100 Å to about 1,000 Å. When the hole transport region includes at least one selected from a hole injection layer and a hole transport layer, the thickness of the hole injection layer may be in a range of about 100 Å to about 9,000 Å, and in some embodiments, about 100 Å to about 1,000 Å, and the thickness of the hole transport layer may be in a range of about 50 Å to about 2,000 Å, and in some embodiments, about 100 Å to about 1,500 Å. When the thicknesses of the hole transport region, the hole injection layer, and the hole transport layer are within any of these ranges, excellent hole transport characteristics may be obtained without a substantial increase in driving voltage.

The hole transport region may include a charge generating material as well as the aforementioned materials, to improve conductive properties of the hole transport region. The charge generating material may be substantially homogeneously or non-homogeneously dispersed in the hole transport region.

The charge generating material may include, for example, a p-dopant.

In some embodiments, a lowest unoccupied molecular orbital (LUMO) of the p-dopant may be −3.5 eV or less.

The p-dopant may include at least one selected from a quinone derivative, a metal oxide, and a cyano group-containing compound, but embodiments are not limited thereto.

In some embodiments, the p-dopant may be selected from a quinone derivative, such as tetracyanoquinodimethane (TCNQ) or 2,3,5,6-tetrafluoro-7,7,8,8-tetracyanoquinodimethane (F4-TCNQ);

a metal oxide, such as tungsten oxide or molybdenum oxide;

1,4,5,8,9,11-hexaazatriphenylene-hexacarbonitrile (HAT-CN); and a compound represented by Formula 221, but embodiments are not limited thereto:

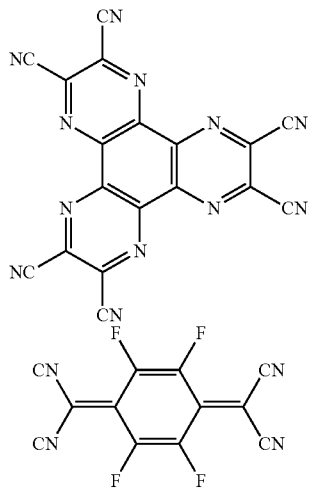

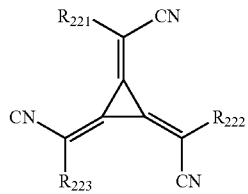

Formula 221 wherein, in Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ may include at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

The first quenching material may satisfy $1.0\ eV \leq T1(Q1) \leq 2.5\ eV$, but embodiments are not limited thereto. When the first quenching material satisfies the range described above, excitons that may deteriorate lifespan by being excessively accumulated in the emission layer may be sufficiently dispersed to the first exciton quenching layer.

The first quenching material may include a compound represented by Formula 3, but embodiments are not limited thereto:

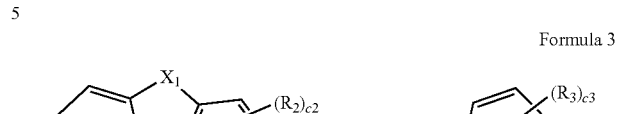

Formula 3

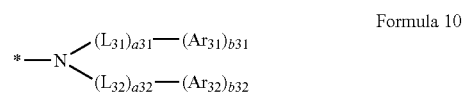

Formula 10 wherein, in Formulae 3 and 10, $X_1$ may be selected from N-$(L_4)_{a4}$-$(Ar_1)_{b1}$, O, and S, A may be a substituted or unsubstituted $C_6$-$C_{20}$ aromatic ring, $L_1$ to $L_4$, $L_{31}$, and $L_{32}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a1 to a4 and a31 to a32 may each independently be selected from 0, 1, 2, and 3, $Ar_1$, $Ar_{31}$, and $Ar_{32}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, b1, b31, and b32 may each independently be selected from 1, 2, 3, 4, and 5, $Ar_{31}$ and $Ar_{32}$ may optionally be bound to each other to form a saturated or unsaturated ring, $R_1$ to $R_4$ may each independently be a group represented by Formula 10, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si(Q1)(Q2)(Q3), and —B(Q1)(Q2), c1 may be selected from 1, 2, 3, and 4, c2 may be selected from 1, 2, and 3, and c3 and c4 may each independently be selected from 1, 2, 3, 4, and 5, and when c1 is 2 or greater, two of $R_1$(s) may optionally be bound to form a saturated or unsaturated ring, when c2 is 2 or greater, two of $R_2$(s) may optionally be bound to form a saturated or unsaturated ring, when c3 is 2 or greater, two of $R_3$(s) may optionally be bound to form a saturated or unsaturated ring, and when c4 is 2 or greater, two of $R_4$(s) may optionally be bound to form a saturated or unsaturated ring, wherein $Q_1$ to $Q_3$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In some embodiments, the first quenching material may be selected from Compounds Q1 to Q36, but embodiments are not limited thereto:

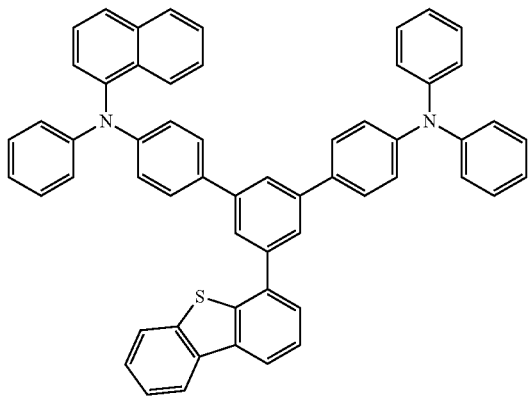

Q2

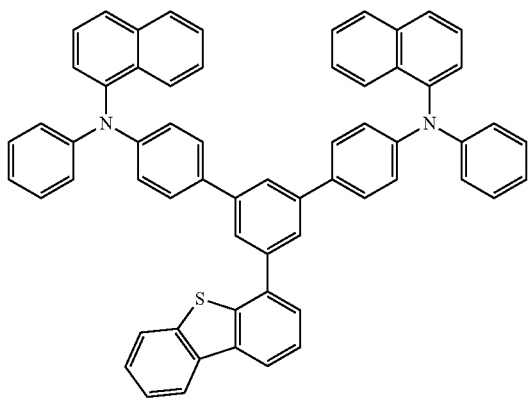

Q3

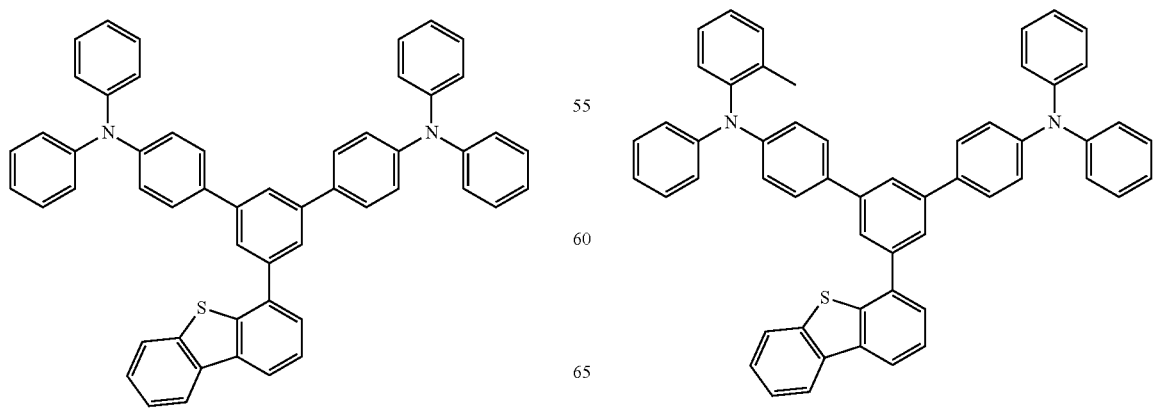

Q1

Q4

Q5
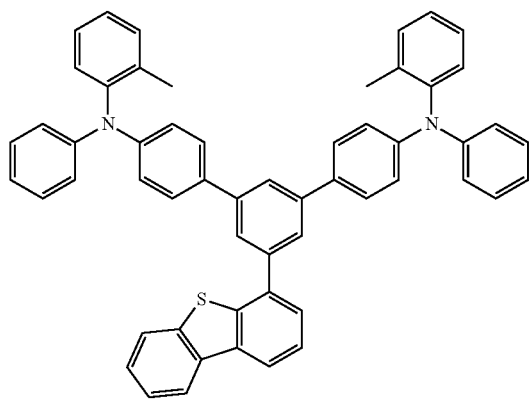
Q8
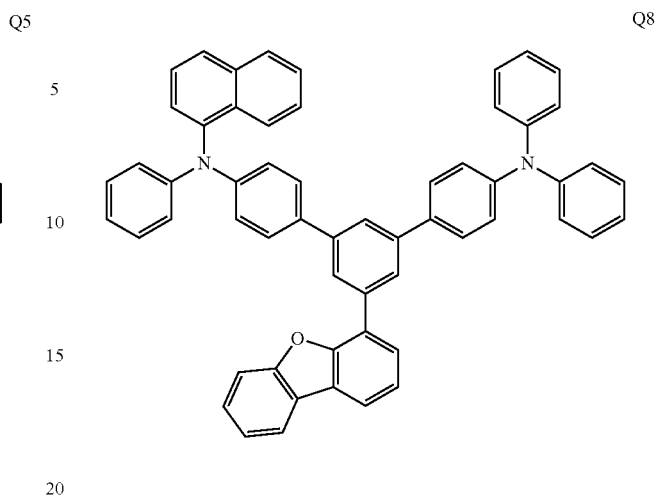
Q6
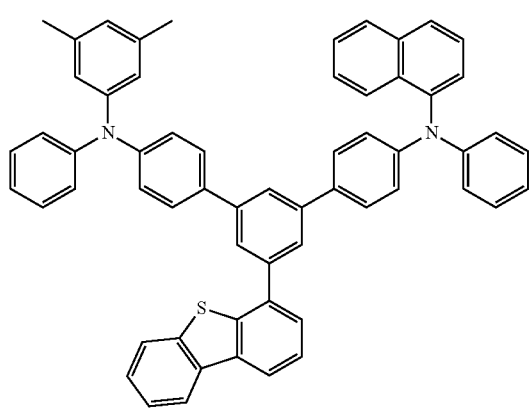
Q9
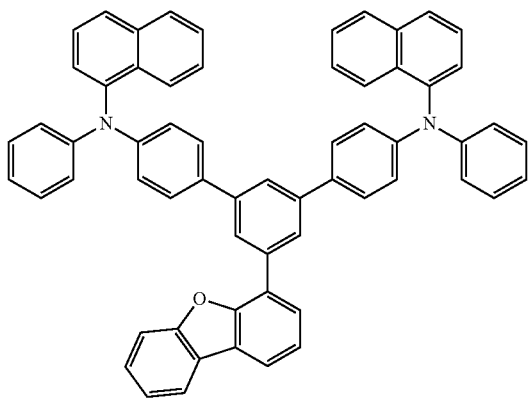
Q7
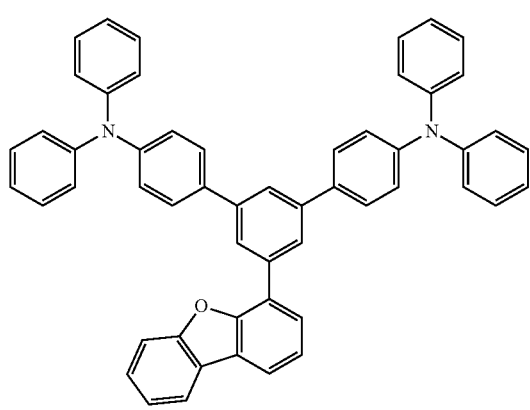
Q10
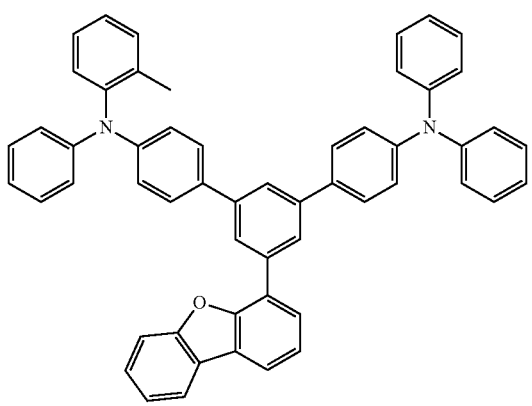

Q11
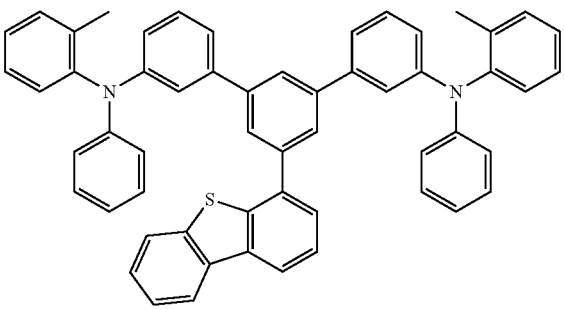
Q14
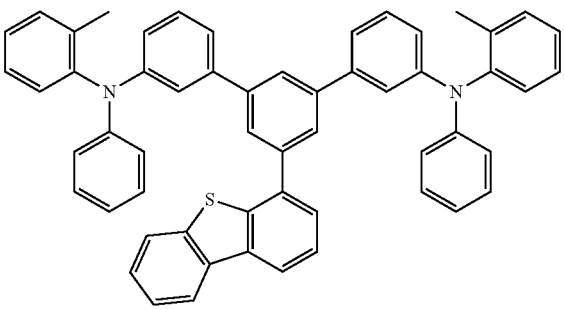
Q12
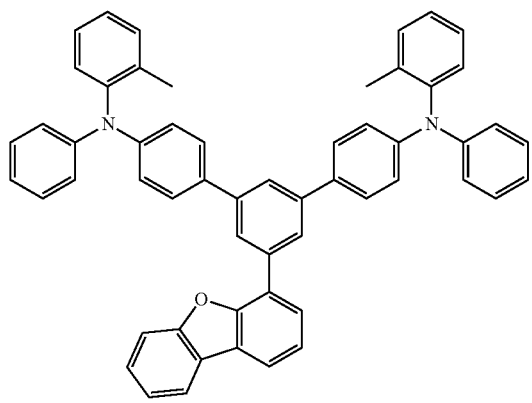
Q15
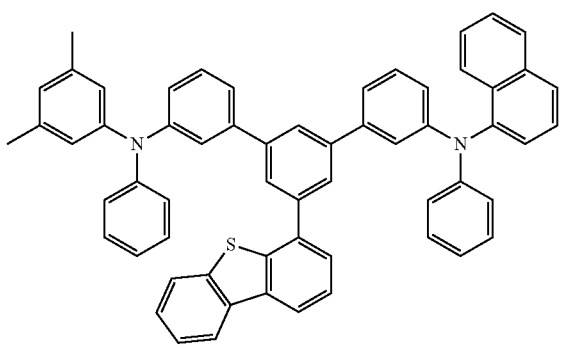
Q16
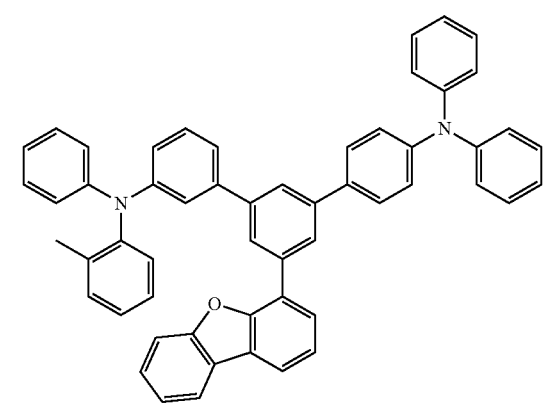
Q13
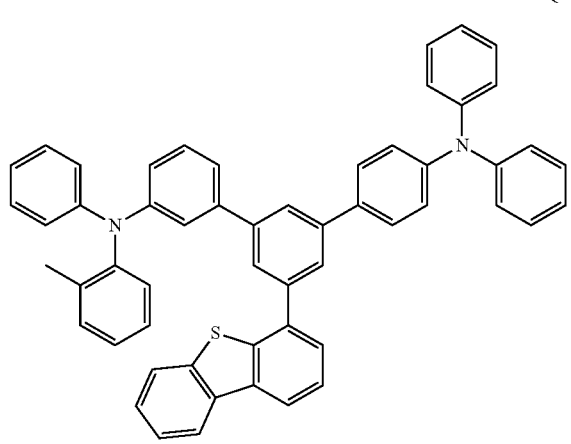
Q17
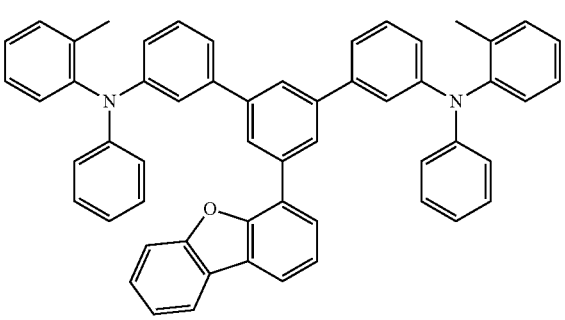

Q18
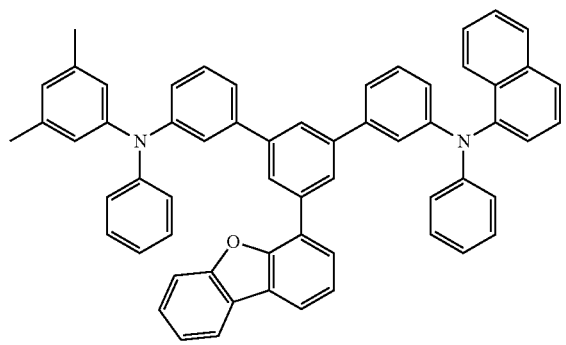
Q21
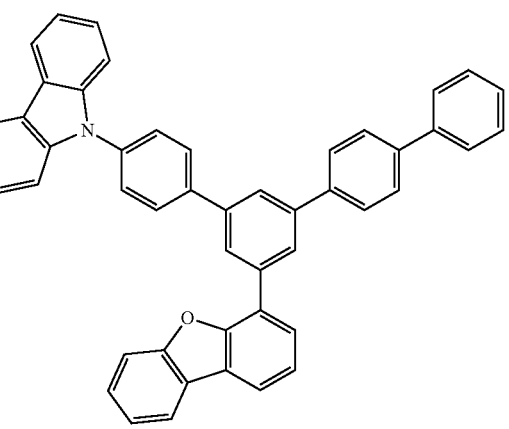
Q19
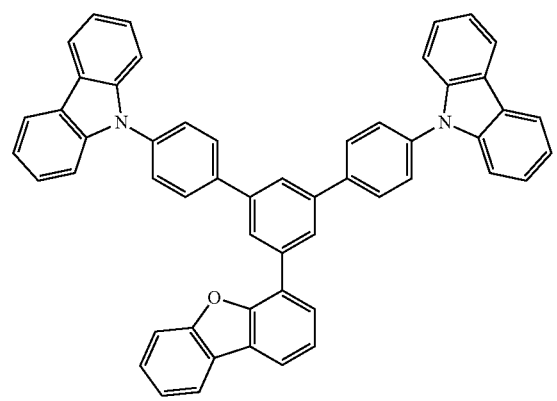
Q22
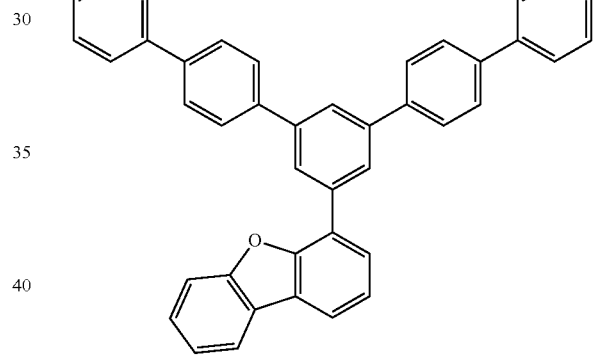
Q20
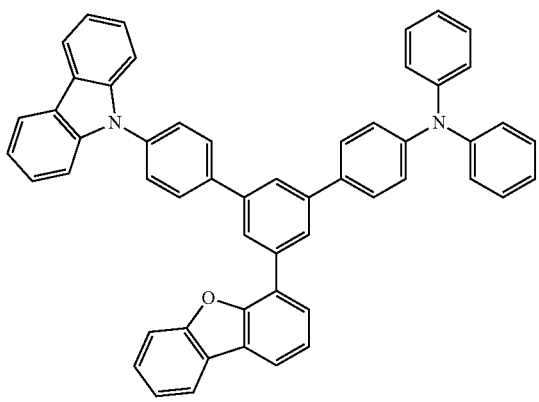
Q23
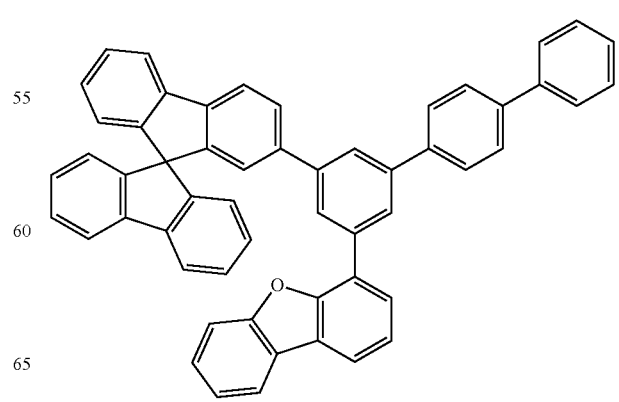

Q24
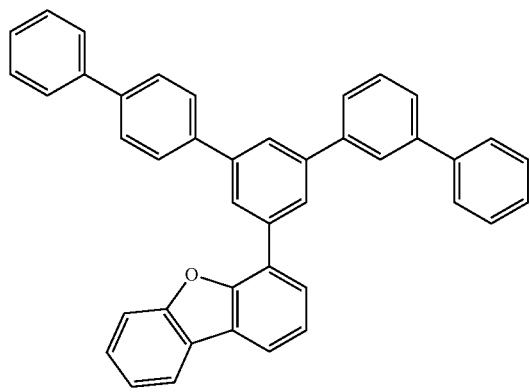
Q27
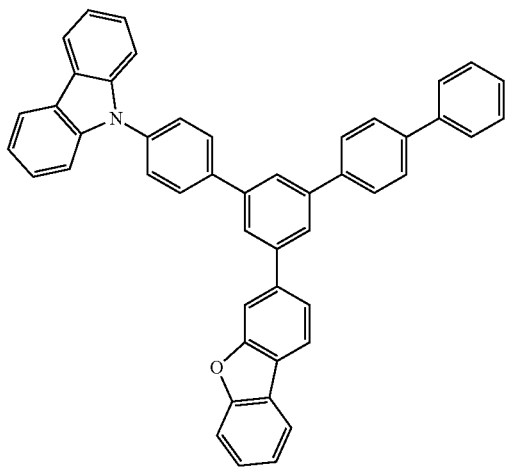
Q25
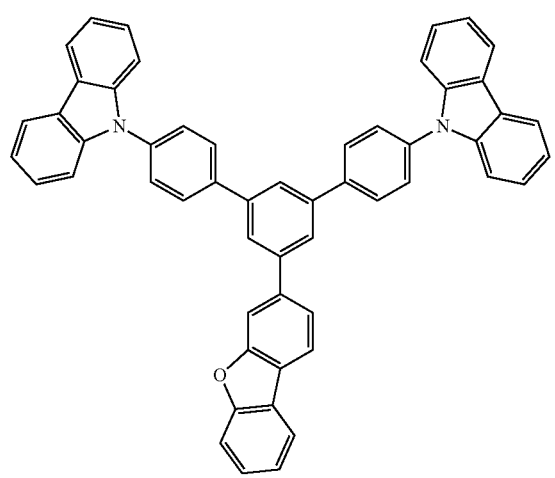
Q28
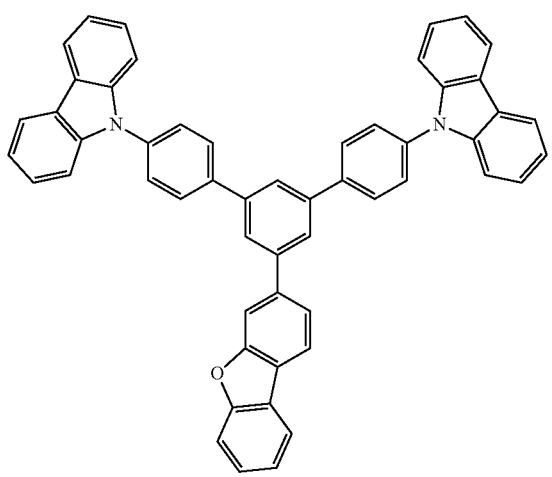
Q26
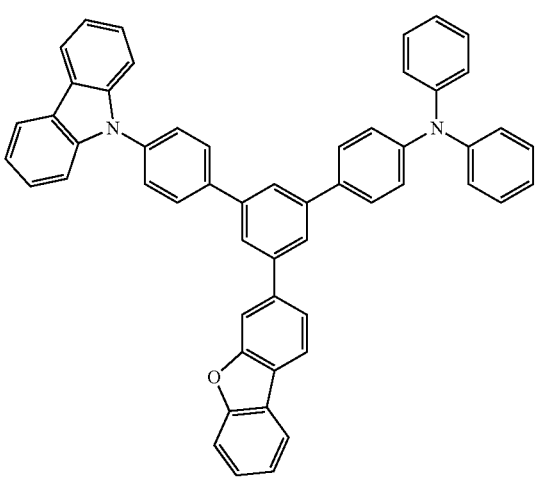
Q29
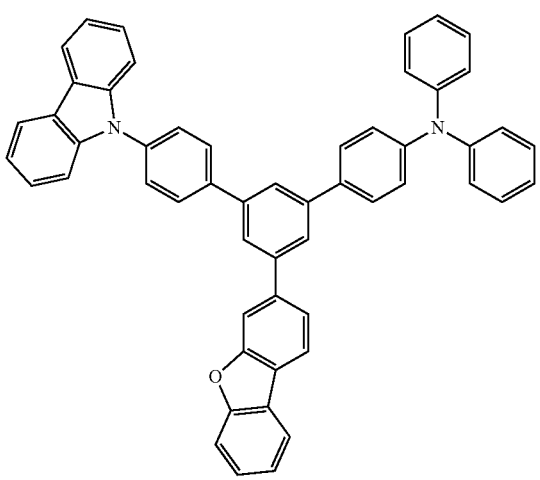

Q30
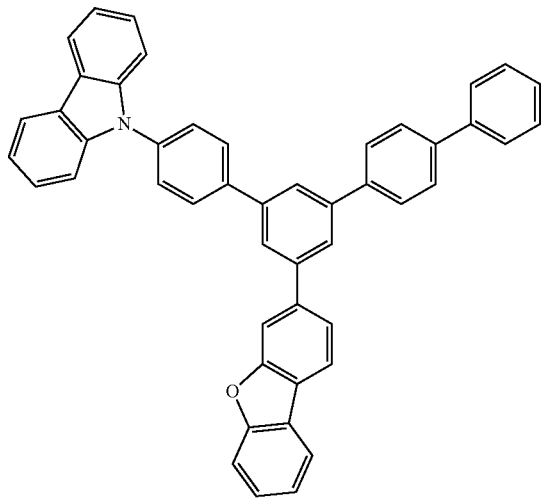
Q31
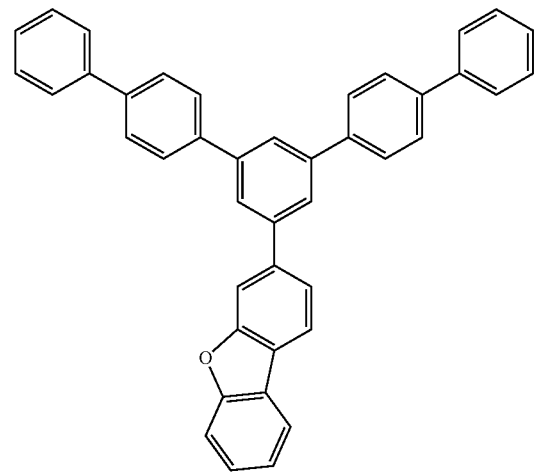
Q32
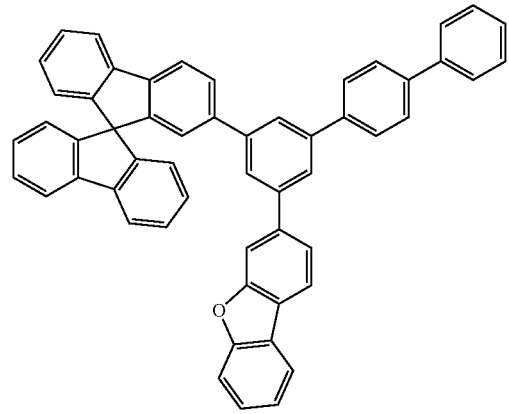
Q33
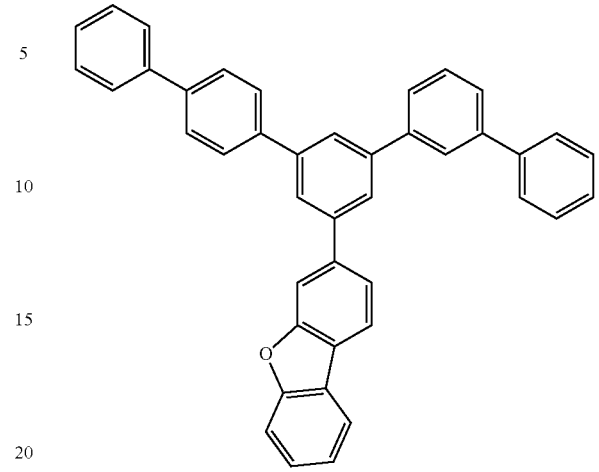
Q34
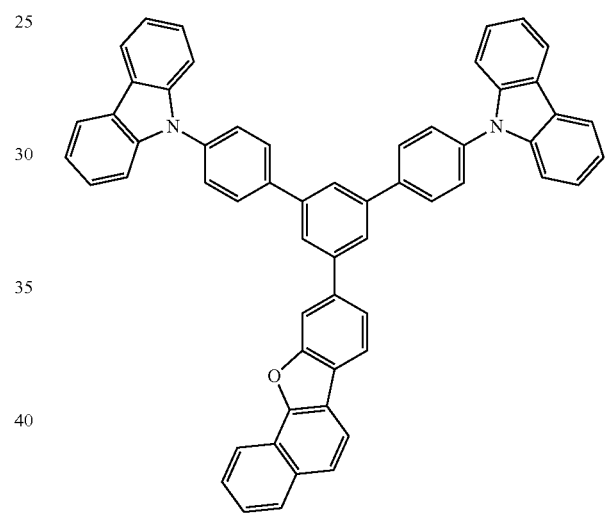
Q35
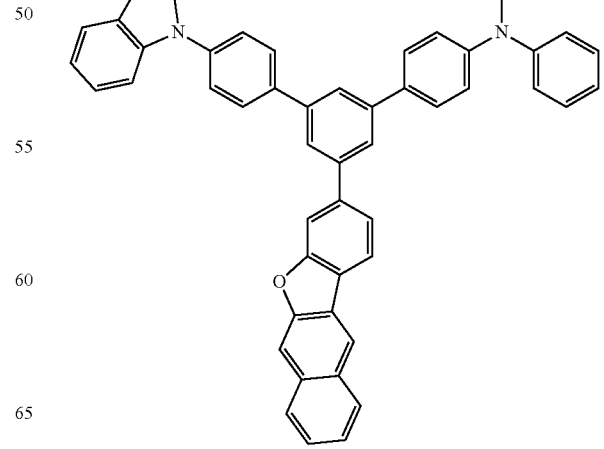

-continued

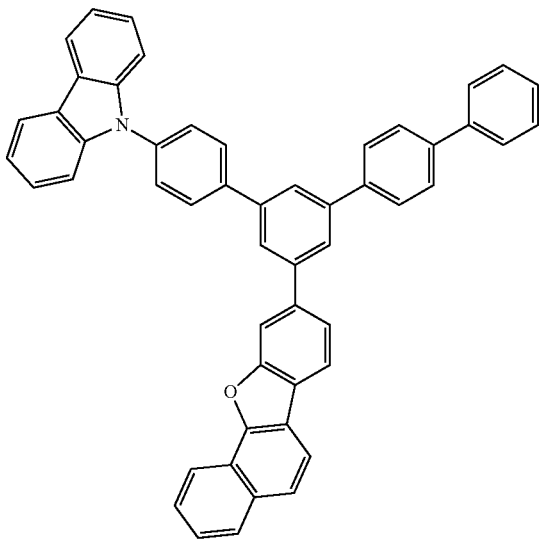

Q36

The content of the first quenching material in the first exciton quenching layer 132 may be in a range of about 0.01 percent by weight (wt %) to about 20 wt %, but embodiments are not limited thereto. When the content is within this range, a sufficient amount of triplets may move from the host to the first exciton quenching layer 132 to a degree for improving lifespan of the organic light-emitting device.

The first exciton quenching layer 132 may further include a first base material, but embodiments are not limited thereto. The first base material may improve hole transportation of the first exciton quenching layer 132.

In some embodiments, the first base material may be identical to the host, but embodiments are not limited thereto. In some embodiments, the first base material may be identical to a hole transporting host, but embodiments are not limited thereto.

In some embodiments, the first exciton quenching layer 132 may consist of a first quenching material and a first base material, but embodiments are not limited thereto.

When the first exciton quenching layer 132 further includes a first base material, the content of the first base material in the first exciton quenching layer 132 may be in a range of about 99.99 wt % to about 80 wt %, but embodiments are not limited thereto. When the content is within this range, hole transportation in the first exciton quenching layer 132 may be sufficiently improved, thus lowering the driving voltage of the organic light-emitting device.

In some embodiments, the first base material may satisfy T1(B1)≤T1(H), wherein T1(B1) indicates the lowest excited triplet energy level of the first base material. The first base material may satisfy T1(B1)≤T1(D).

In some embodiments, the first base material may satisfy 1.2 eV≤T1(B1)≤2.5 eV, but embodiments are not limited thereto. When the first base material satisfies the range described above, excitons that may deteriorate lifespan by being excessively accumulated in the emission layer may be sufficiently dispersed to the first exciton quenching layer.

In some embodiments, a thickness of the emission layer 131 ($D_E$) and a thickness of the first exciton quenching layer 132 ($D_{Q1}$) satisfy $D_E \geq D_{Q1}$. In some embodiments, $D_E$ and $D_{Q1}$ may satisfy $D_E > D_{Q1}$, but embodiments are not limited thereto. When this range (e.g., relationship) is satisfied, the organic light-emitting device may have improved lifespan while not increasing the driving voltage.

In some embodiments, a thickness of the first exciton quenching layer 132 may be in a range of about 50 Å to about 200 Å, but embodiments are not limited thereto. When this range is satisfied, the organic light-emitting device may have improved lifespan while not substantially increasing the driving voltage.

The emission layer 131 may include a host and a dopant.

The dopant may emit thermal activated delayed fluorescence or fluorescence.

In some embodiments, the dopant may satisfy Equation 3:

$$|S1(D) - T1(D)| \leq 0.5 \text{ eV} \qquad \text{Equation 3}$$

wherein, in Equation 3,

T1(D) indicates a lowest excited triplet energy level of the dopant, and

S1(D) indicates a lowest excited singlet energy level of the dopant.

When Equation 3 is satisfied, thermal activated delayed fluorescence may be emitted even at room temperature.

In some embodiments, the dopant may satisfy |S1(D)−T1(D)|≤0.2 eV, but embodiments are not limited thereto.

In some embodiments, the dopant may further satisfy Equation 4 and/or Equation 5, but embodiments are not limited thereto:

$$2.65 \text{ eV} \leq S1(D) \leq 2.85 \text{ eV} \qquad \text{Equation 4}$$

$$2.65 \text{ eV} \leq T1(D) \leq 3.05 \text{ eV} \qquad \text{Equation 5}$$

wherein, in Equations 4 and 5,

T1(D) indicates a lowest excited triplet energy level of the dopant, and

S1(D) indicates a lowest excited singlet energy level of the dopant.

When Equation 4 and/or Equation 5 is satisfied, the dopant may emit blue light.

In some embodiments, the dopant may not include a metal atom. That is, the dopant is different from a phosphorescence-emitting emitter including a metal atom.

A content of the dopant in the emission layer may be in a range of about 0.01 wt % to about 30 wt %, but embodiments are not limited thereto.

In some embodiments, the host may satisfy T1(H)≥T1(D), but embodiments are not limited thereto. When the host satisfies this range (e.g., when the host and the dopant satisfy this relationship), excitons may move from the host to the dopant smoothly.

In some embodiments, the host may include at least one compound.

In some embodiments, the host may include a compound represented by any one of Formulae 1 and 2, but embodiments are not limited thereto:

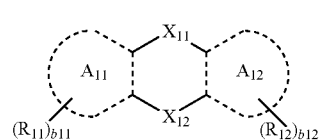

Formula 1

Formula 2

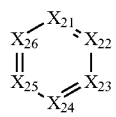

wherein, in Formulae 1 and 2, $X_{11}$ may be selected from O, S, $N(R_{13})$, and $C(R_{13})(R_{14})$, $X_{12}$ may be selected from a single bond, O, S, $N(R_{15})$, and $C(R_{15})(R_{16})$, $A_{11}$ and $A_{12}$ may each independently be selected from a $C_5$-$C_{60}$ carbocyclic group and a $C_1$-$C_{60}$ heterocyclic group, and $R_{11}$ to $R_{16}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), and b11 and b12 may each independently be selected from 1, 2, 3, 4, 5, and 6, and wherein $Q_1$ to $Q_3$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a biphenyl group, and a terphenyl group, $X_{21}$ may be N or $C(R_{21})$, $X_{22}$ may be N or $C(R_{22})$, $X_{23}$ may be N or $C(R_{23})$, $X_{24}$ may be N or $C(R_{24})$, $X_{25}$ may be N or $C(R_{25})$, $X_{26}$ may be N or $C(R_{26})$, provided that at least one selected from $X_{21}$ to $X_{26}$ may be N, $R_{21}$ to $R_{26}$ may each independently be selected from hydrogen, deuterium, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and at least one of $R_{21}$ to $R_{26}$ may be selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group. In some embodiments, the host may be selected from Compounds 1 to 12 and 21 to 27, but embodiments are not limited thereto:

1

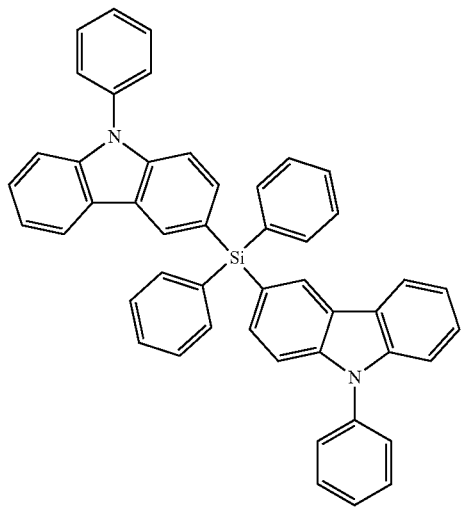

2

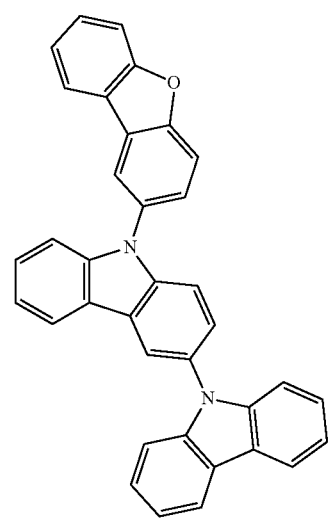

3

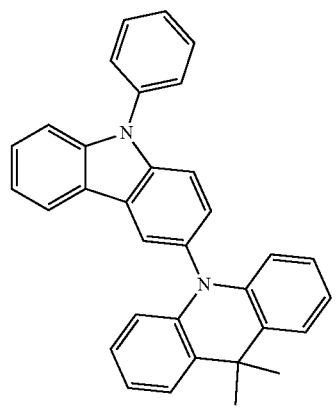

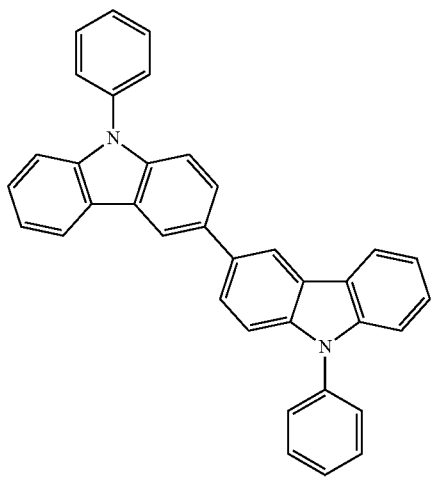
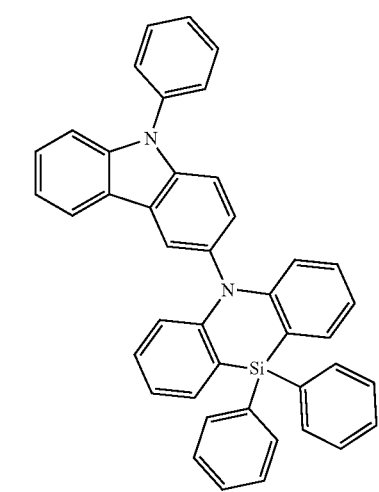
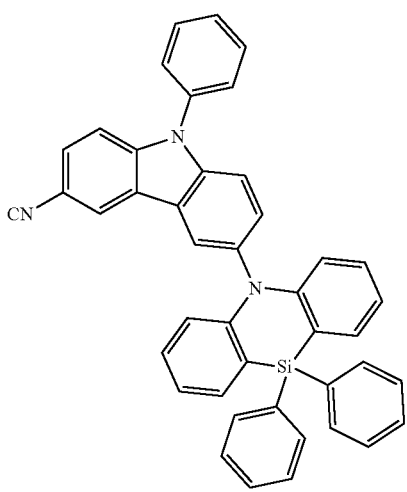
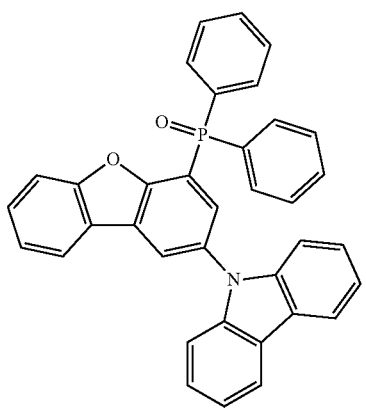
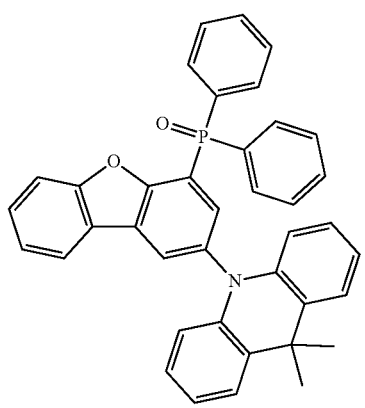
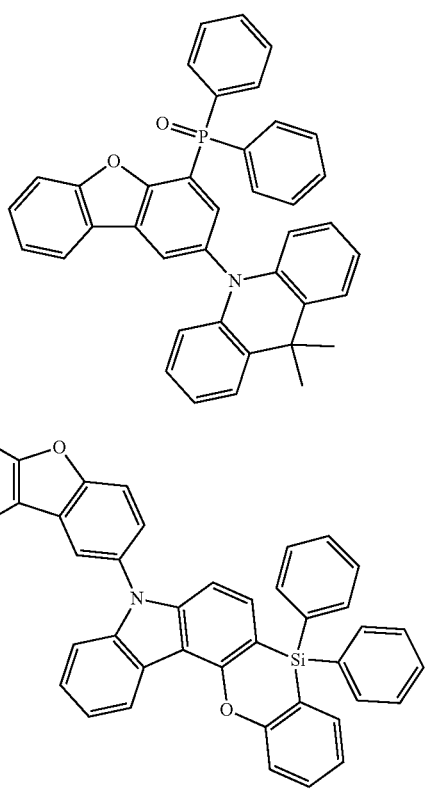

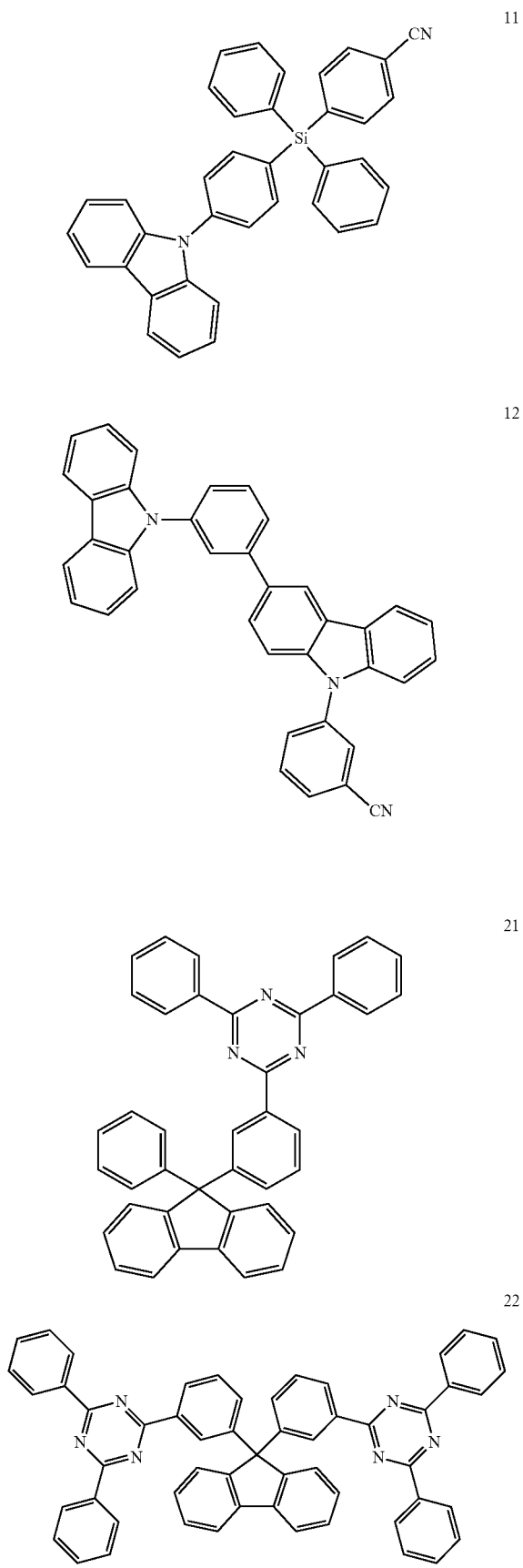
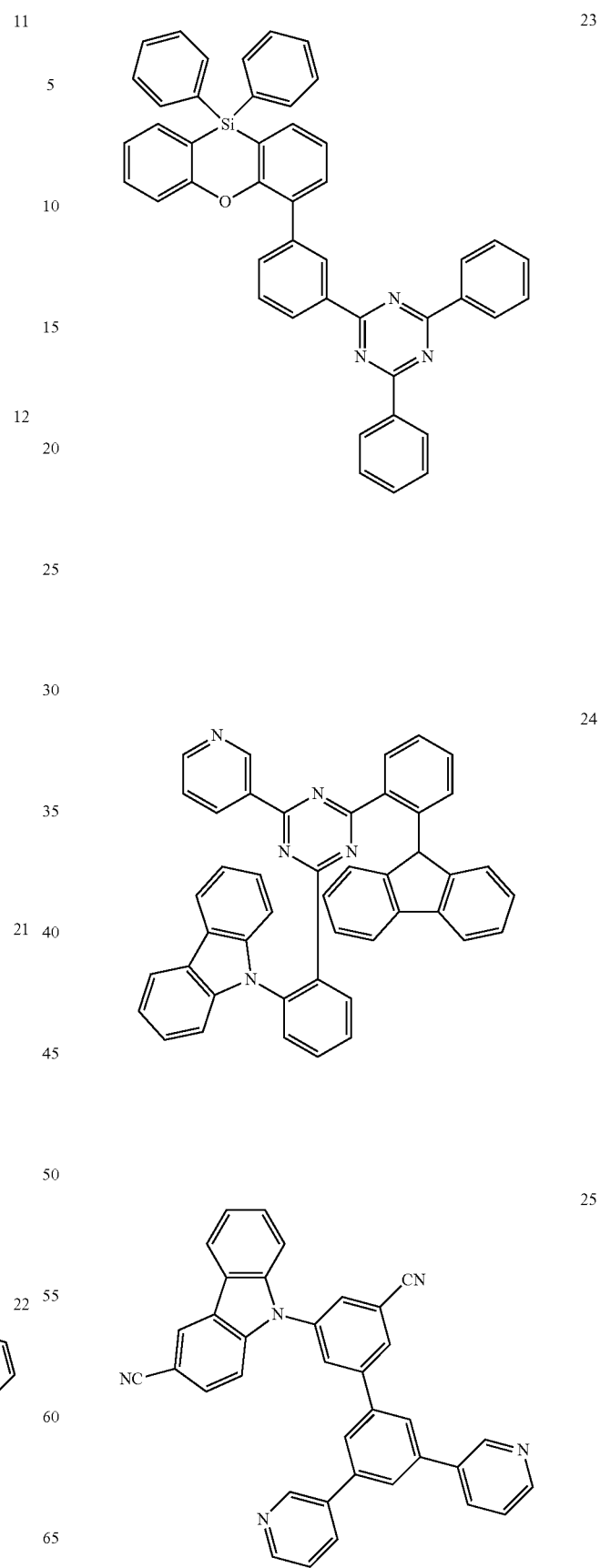

26

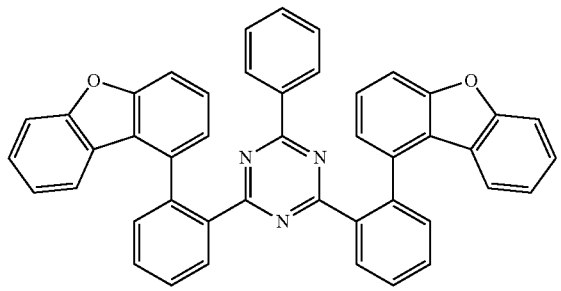

27

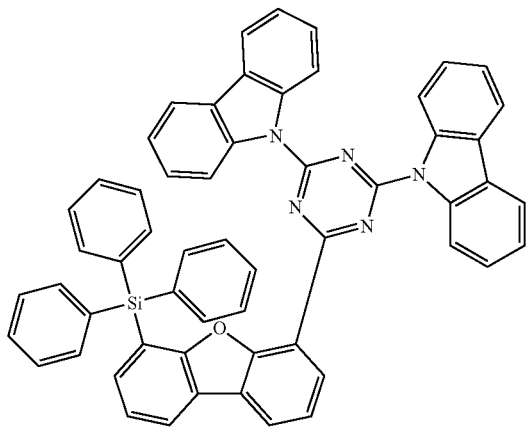

According to one or more embodiments, the host may include a first host and a second host.

According to one or more embodiments, the first host may be a hole transporting host not including an electron transporting moiety, and the second host may be an electron transporting host including at least one electron transporting moiety, but embodiments are not limited thereto.

The term "electron transporting moiety", as used herein, may include a cyano group, a phosphine oxide group, a sulfone oxide group, a sulfonate group, and/or a π electron-depleted nitrogen-containing ring.

For example, the first host may be represented by Formula 1, and the second host may be represented by Formula 2, but embodiments are not limited thereto.

In some embodiments, the first host may be selected from Compounds 1 to 12, and the second host may be selected from Compounds 21 to 27, but embodiments are not limited thereto.

In some embodiments, the first host may include the compound represented by Formula 1, and the second host may include the compound represented by Formula 2.

The thickness of the emission layer 131 may be in a range of about 100 Å to about 1,000 Å, and in some embodiments, about 200 Å to about 600 Å. When the thickness of the emission layer is within any of these ranges, improved luminescence characteristics may be obtained without a substantial increase in driving voltage.

The electron transport region may have i) a single-layered structure consisting of a single layer consisting of a single material, ii) a single-layered structure consisting of a single layer including a plurality of different materials, or iii) a multi-layered structure each having a plurality of layers, each having a plurality of different materials (e.g., a multi-layered structure, each layer having a plurality of different materials).

The electron transport region may include at least one selected from a buffer layer, a hole blocking layer, an electron control layer, an electron transport layer, and an electron injection layer, but embodiments are not limited thereto.

In some embodiments, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein layers of each structure are sequentially stacked on the emission layer in each stated order, but embodiments are not limited thereto.

The electron transport region (for example, the buffer layer, the hole blocking layer, the electron control layer, or the electron transport layer in the electron transport region) may include a metal-free compound including at least one π electron-depleted nitrogen-containing ring.

The term "π electron-depleted nitrogen-containing ring" as used herein refers to a $C_1$-$C_{60}$ heterocyclic group having at least one *—N=*' moiety as a ring-forming moiety.

For example, the "π electron-depleted nitrogen-containing ring" may be i) a 5-membered to 7-membered heteromonocyclic group having at least one *—N=*' moiety, ii) a heteropolycyclic group in which at least two 5-membered to 7-membered heteromonocyclic groups, each having at least one *—N=*' moiety, are condensed, or iii) a heteropolycyclic group in which at least one of a 5-membered to 7-membered heteromonocyclic group, each having at least one *—N=*' moiety, is condensed with at least one $C_5$-$C_{60}$ carbocyclic group.

Examples of the π electron-depleted nitrogen-containing ring may include imidazole, pyrazole, thiazole, isothiazole, oxazole, isoxazole, pyridine, pyrazine, pyrimidine, pyridazine, indazole, purine, quinoline, isoquinoline, benzoquinoline, phthalazine, naphthyridine, quinoxaline, quinazoline, cinnoline, phenanthridine, acridine, phenanthroline, phenazine, benzimidazole, isobenzothiazole, benzoxazole, isobenzoxazole, triazole, tetrazole, oxadiazole, triazine, thiadiazole, imidazopyridine, imidazopyrimidine, and azacarbazole, but embodiments are not limited thereto.

In some embodiments, the electron transport region may include a compound represented by Formula 601:

$$[Ar_{601}]_{xe11}-[(L_{601})_{xe1}-R_{601}]_{xe21} \quad \text{Formula 601}$$

wherein, in Formula 601, $Ar_{601}$ may be selected from a substituted or unsubstituted $C_5$-$C_{60}$ carbocyclic group and a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), and —P(=O)($Q_{601}$)($Q_{602}$), wherein $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In an embodiment, at least one of $Ar_{601}$(s) in the number of xe11 and $R_{601}$(s) in the number of xe21 may include the π electron-depleted nitrogen-containing ring.

In some embodiments, in Formula 601, $Ar_{601}$ may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is 2 or greater, at least two $Ar_{601}$(s) may be bound via a single bond.

In one or more embodiments, $Ar_{601}$ in Formula 601 may be an anthracene group.

In one or more embodiments, a compound represented by Formula 601 may be represented by Formula 601-1:

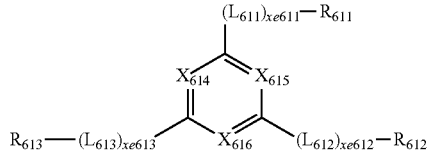

Formula 601-1 wherein, in Formula 601-1, $X_{614}$ may be N or C($R_{614}$), $X_{615}$ may be N or C($R_{615}$), $X_{616}$ may be N or C($R_{616}$), at least one selected from $X_{614}$ to $X_{616}$ may be N, $L_{611}$ to $L_{613}$ may each independently be understood by referring to the description of $L_{601}$ provided herein, xe611 to xe613 may each independently be understood by referring to the description of xe1 provided herein, $R_{611}$ to $R_{613}$ may each independently be understood by referring to the description of $R_{601}$ provided herein, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In an embodiment, in Formulae 601 and 601-1, $L_{601}$ and $L_{611}$ to $L_{613}$ may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments are not limited thereto.

In one or more embodiments, xe1 and xe611 to xe613 in Formulae 601 and 601-1 may each independently be 0, 1, or 2.

In one embodiment, in Formulae 601 and 601-1, $R_{601}$ and $R_{611}$ to $R_{613}$ may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(=O)$_2$(Q$_{601}$) and —P(=O)(Q$_{601}$)(Q$_{602}$), wherein Q$_{601}$ and Q$_{602}$ may respectively be understood by referring to the descriptions of Q$_{601}$ and Q$_{602}$ provided herein.

The electron transport region may include at least one compound selected from Compounds ET1 to ET36, but embodiments are not limited thereto:

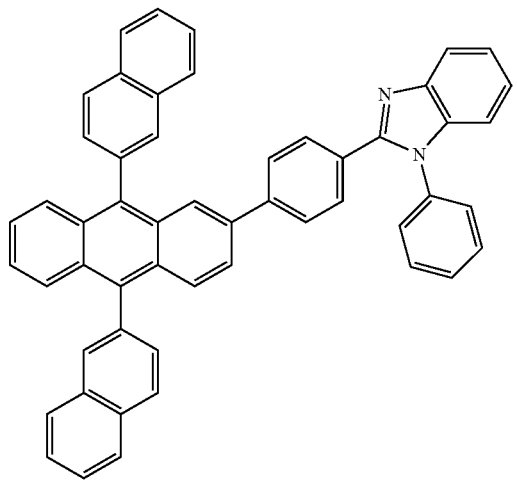

ET1

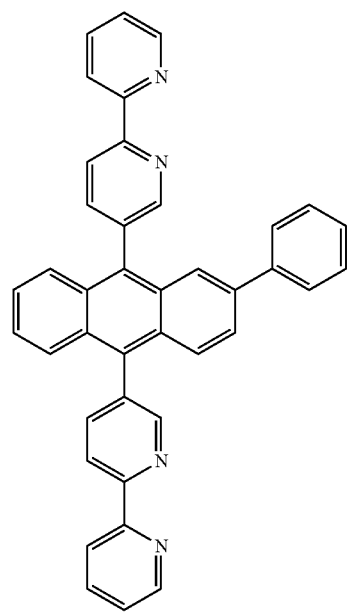

ET2

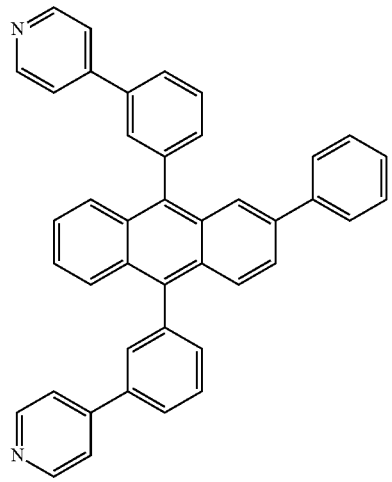

ET3

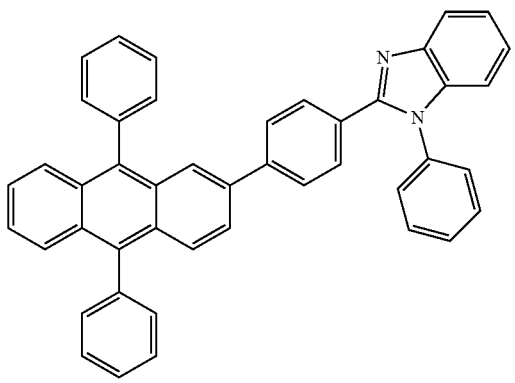

ET4

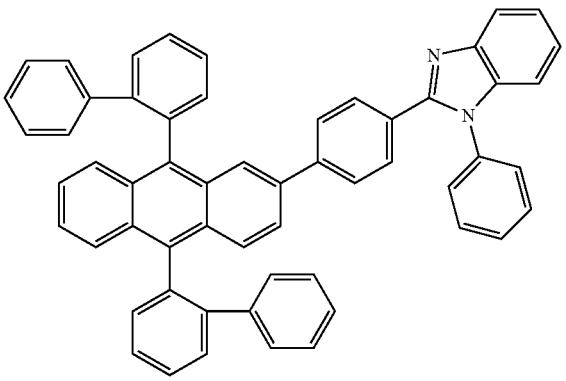

ET5

ET6
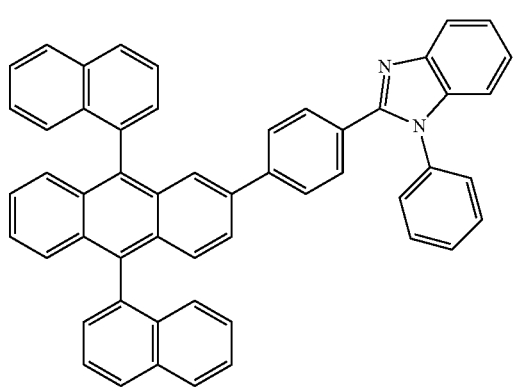
ET7
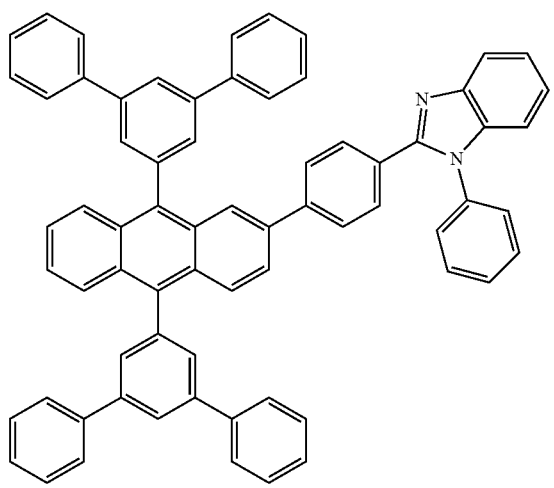
ET8
ET9
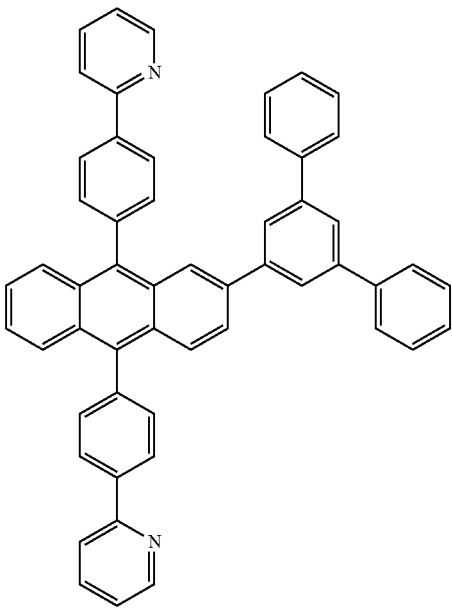
ET10
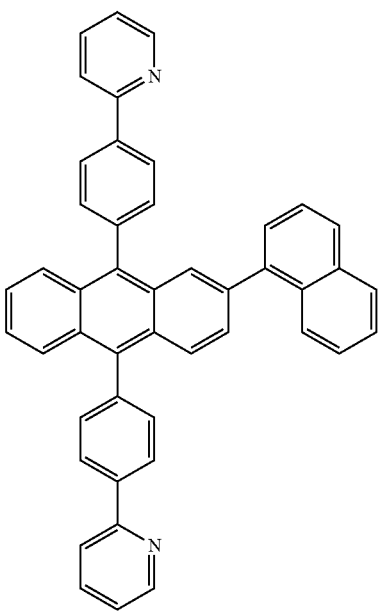

ET11
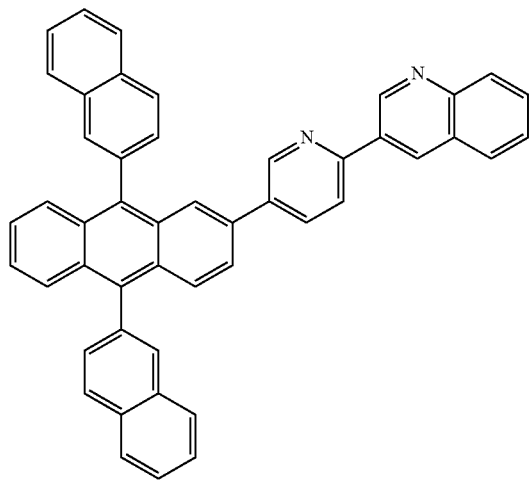
ET12
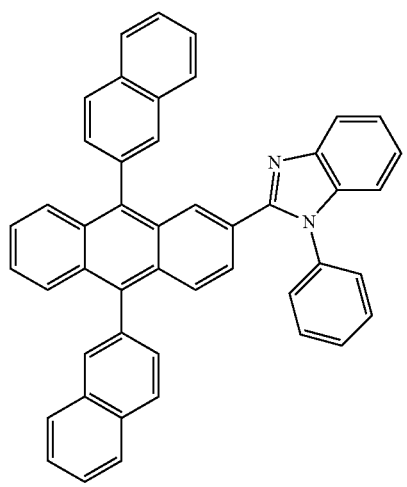
ET13
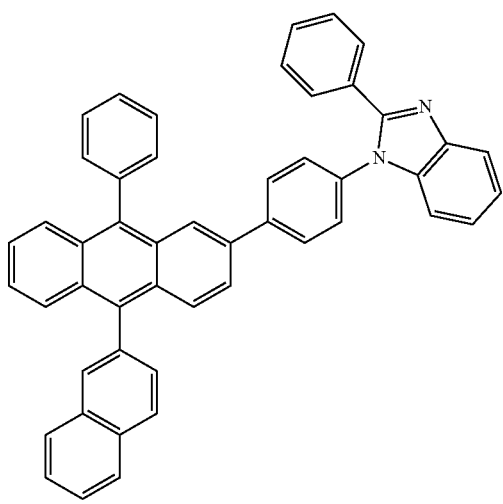
ET14
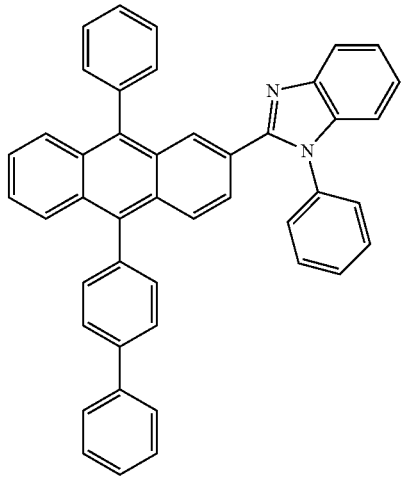
ET15
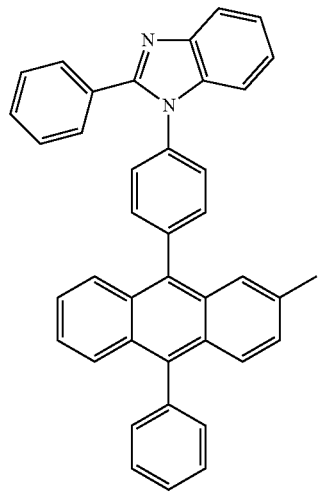
ET16
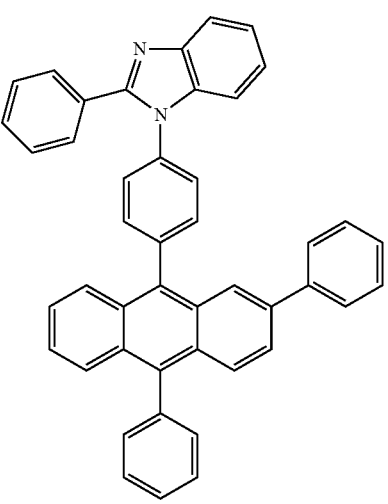

-continued
ET17
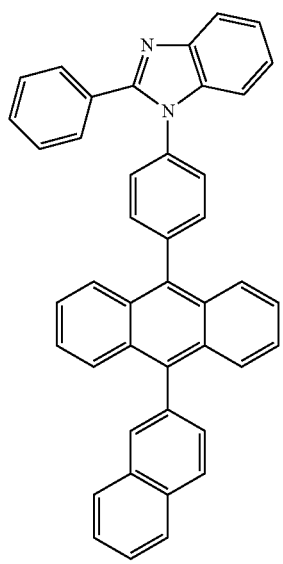
ET18
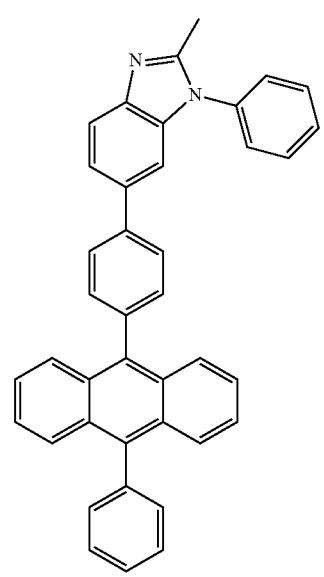
ET19
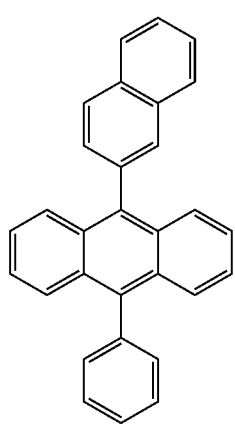
ET20
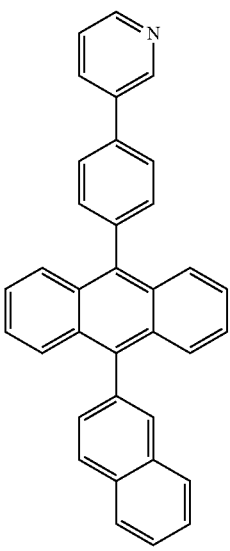
ET21
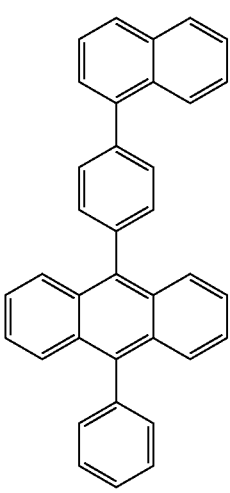
ET22
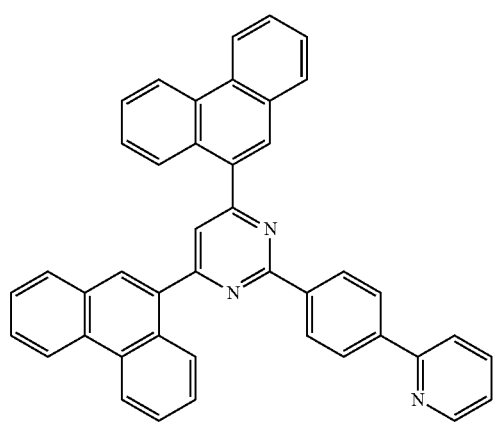

ET23
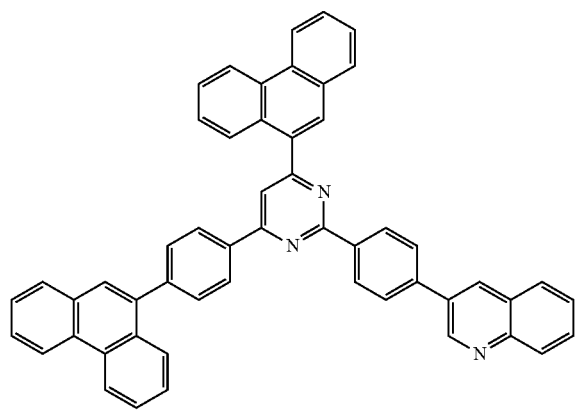
ET26
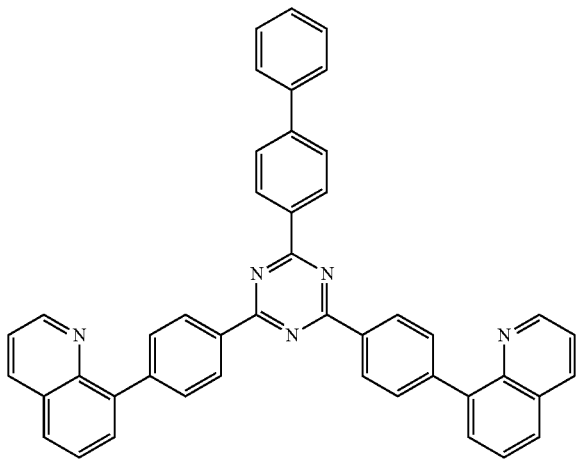
ET24
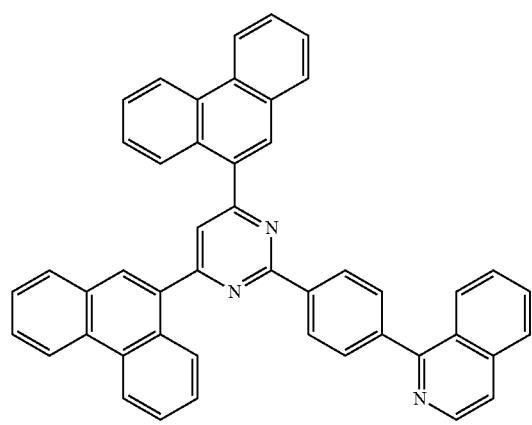
ET27
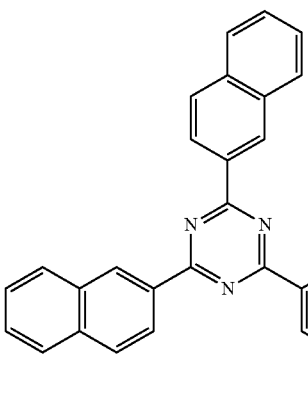
ET25
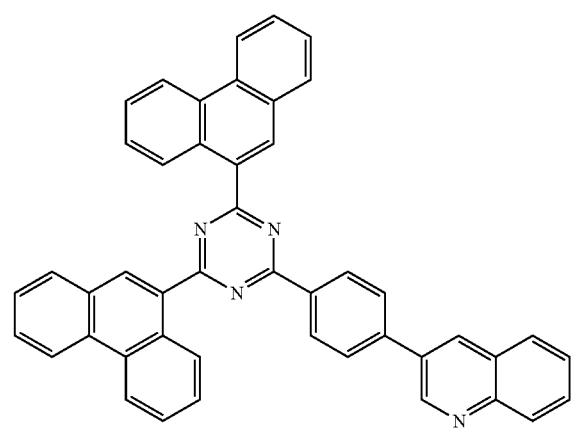
ET28
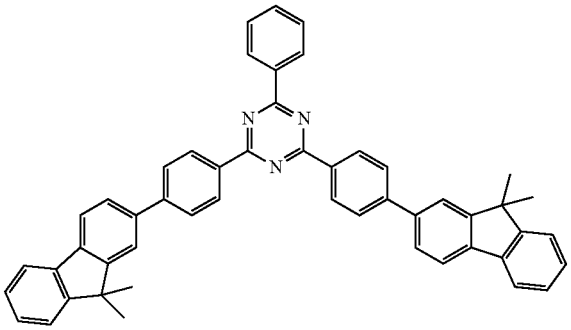

ET29
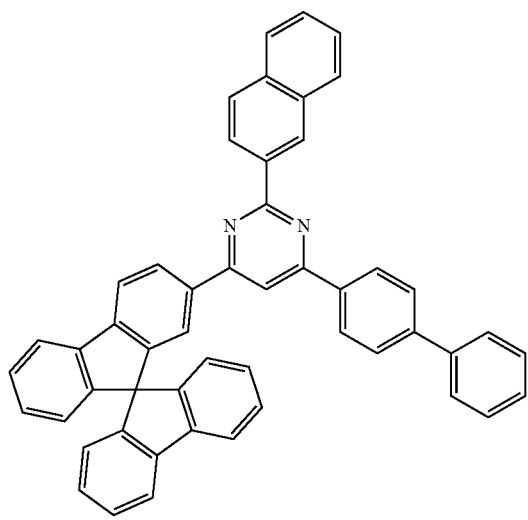
ET30
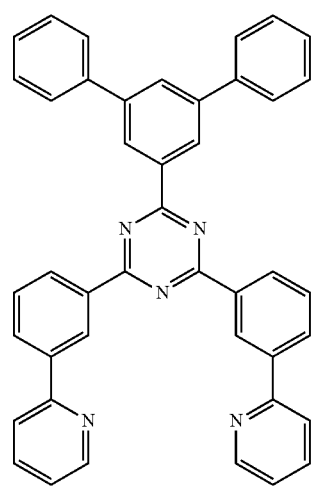
ET31
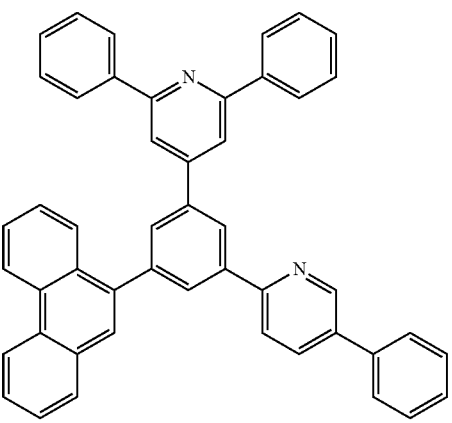
ET32
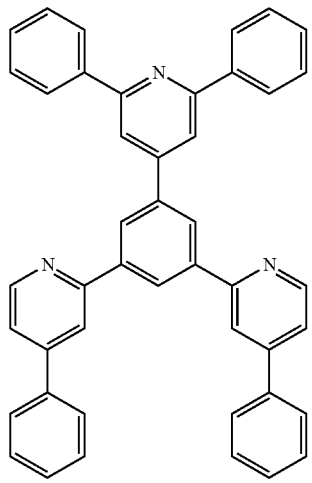
ET33
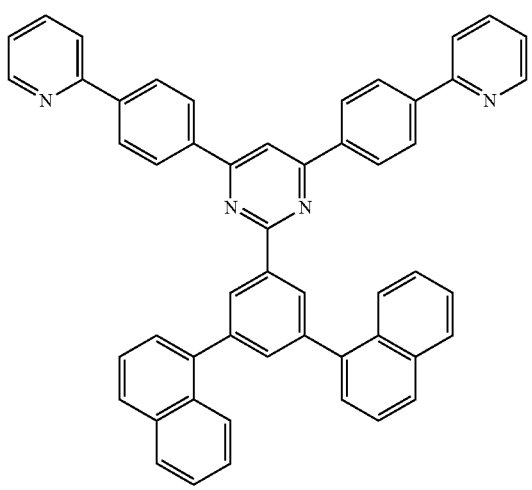
ET34
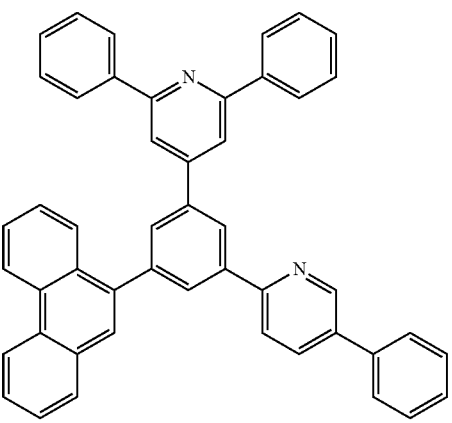

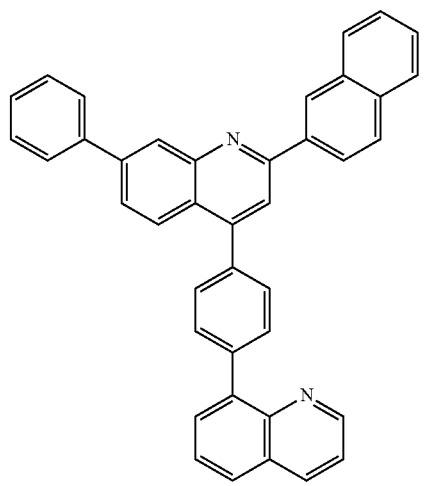

ET35

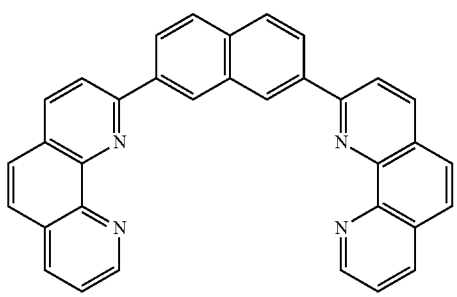

ET36

In some embodiments, the electron transport region may include at least one compound selected from 2,9-dimethyl-4,7-diphenyl-1,10-phenanthroline (BCP), 4,7-diphenyl-1,10-phenanthroline (Bphen), Alq$_3$, BAlq, 3-(biphenyl-4-yl)-5-(4-tert-butylphenyl)-4-phenyl-4H-1,2,4-triazole (TAZ), NTAZ, diphenyl[4-(triphenylsilyl)phenyl]phosphine oxide (TSPO1), 2,2',2''-(1,3,5-benzinetriyl)-tris(1-phenyl-1-H-benzimidazole) (TPBi), and diphenylphosphine oxide (DPEPO):

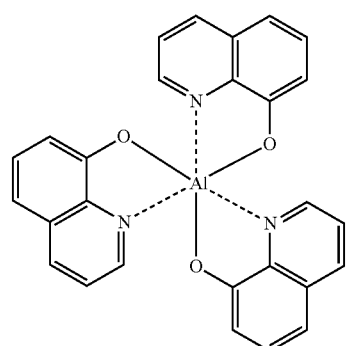

Alq$_3$

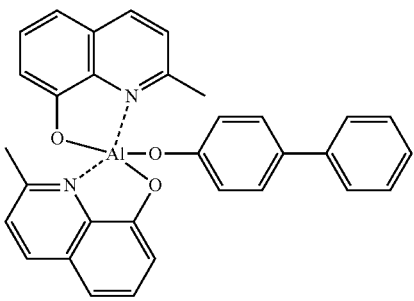

BAlq

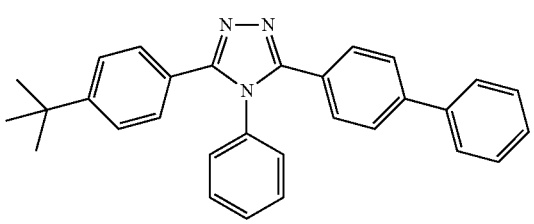

TAZ

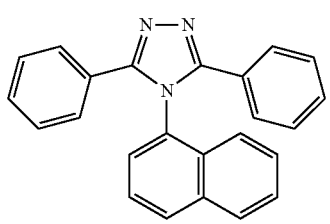

NTAZ

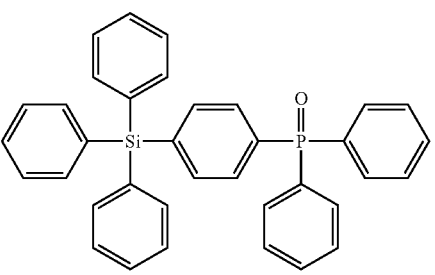

TSPO1

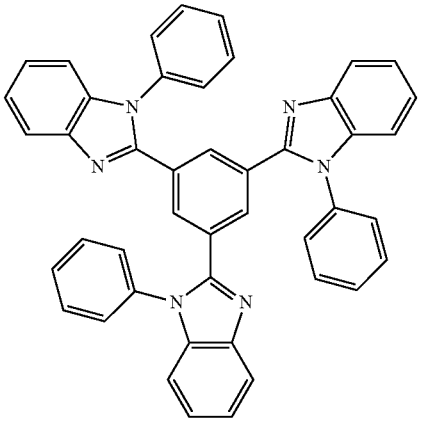

TPBI

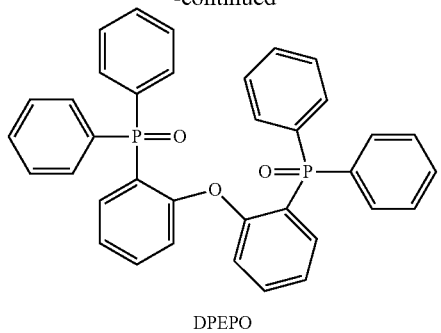

DPEPO

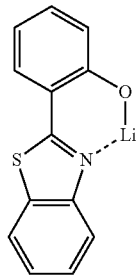

ET-D2

The thicknesses of the buffer layer, the hole blocking layer, or the electron control layer may each independently be in a range of about 20 Å to about 1,000 Å, and in some embodiments, about 30 Å to about 300 Å. When the thicknesses of the buffer layer, the hole blocking layer or the electron control layer are within any of these ranges, excellent hole blocking characteristics or excellent electron controlling characteristics may be obtained without a substantial increase in driving voltage.

The thickness of the electron transport layer may be in a range of about 100 Å to about 1,000 Å, and in some embodiments, about 150 Å to about 500 Å. When the thickness of the electron transport layer is within any of these ranges, excellent electron transport characteristics may be obtained without a substantial increase in driving voltage.

The electron transport region (for example, the electron transport layer in the electron transport region) may further include, in addition to the materials described above, a metal-containing material.

The metal-containing material may include at least one selected from an alkali metal complex and an alkaline earth metal complex. The alkali metal complex may include a metal ion selected from a lithium (Li) ion, a sodium (Na) ion, a potassium (K) ion, a rubidium (Rb) ion, and a cesium (Cs) ion. The alkaline earth metal complex may include a metal ion selected from a beryllium (Be) ion, a magnesium (Mg) ion, a calcium (Ca) ion, a strontium (Sr) ion, and a barium (Ba) ion. Each ligand coordinated with the metal ion of the alkali metal complex and the alkaline earth metal complex may independently be selected from hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, and cyclopentadiene, but embodiments are not limited thereto.

For example, the metal-containing material may include a Li complex. The Li complex may include, e.g., Compound ET-D1 (LiQ) or Compound ET-D2:

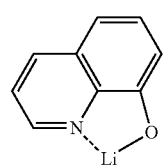

ET-D1

The electron transport region may include an electron injection layer that facilitates injection of electrons from the cathode 120. A work function of the electron injection layer may be less than 3.0 electron volts (eV). When the work function is within this range, injection of electrons from the cathode 120 may occur rapidly, causing recombination of electrons and holes to occur near a hole transport region rather than the center of the emission layer. Accordingly, when the first exciton quenching layer 132 is between the anode 110 and the emission layer 131, lifespan of the organic light-emitting device may be more effectively improved.

The electron injection layer may be in direct contact with the cathode 120.

The electron injection layer may have i) a single-layered structure consisting of a single layer consisting of a single material, ii) a single-layered structure consisting of a single layer including a plurality of different materials, or iii) a multi-layered structure having a plurality of layers, each including a plurality of different materials.

The electron injection layer may include an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof.

The alkali metal may be selected from Li, Na, K, Rb, and Cs. In some embodiments, the alkali metal may be Li, Na, or Cs. In one or more embodiments, the alkaline metal may be Li or Cs, but is not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth metal compound, and the rare earth metal compound may each independently be selected from oxides and halides (e.g., fluorides, chlorides, bromides, or iodines) of the alkali metal, the alkaline earth metal, and the rare earth metal, respectively.

The alkali metal compound may be selected from alkali metal oxides, such as $Li_2O$, $Cs_2O$, or $K_2O$, and alkali metal halides, such as LiF, NaF, CsF, KF, LiI, NaI, CsI, KI, or RbI. In an embodiment, the alkali metal compound may be selected from LiF, $Li_2O$, NaF, LiI, NaI, CsI, and KI, but embodiments are not limited thereto.

The alkaline earth-metal compound may be selected from alkaline earth-metal compounds, such as BaO, SrO, CaO, $Ba_xSr_{1-x}O$ (wherein $0<x<1$), or $Ba_xCa_{1-x}O$ (wherein $0<x<1$). In an embodiment, the alkaline earth metal compound may be selected from BaO, SrO, and CaO, but embodiments are not limited thereto.

The rare earth metal compound may be selected from $YbF_3$, $ScF_3$, $ScO_3$, $Y_2O_3$, $Ce_2O_3$, $GdF_3$, and $TbF_3$. In some embodiments, the rare earth metal compound may be selected from $YbF_3$, $ScF_3$, $TbF_3$, $YbI_3$, $ScI_3$, and $TbI_3$, but embodiments are not limited thereto.

The alkali metal complex, the alkaline earth metal complex, and the rare earth metal complex may each include ions of the above-described alkali metal, alkaline earth metal, and rare earth metal. Each ligand coordinated with the metal ion of the alkali metal complex, the alkaline earth metal complex, and the rare earth metal complex may independently be selected from hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, and cyclopentadiene, but embodiments are not limited thereto.

The electron injection layer may consist of an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof, as described above. In some embodiments, the electron injection layer may further include an organic material. When the electron injection layer further includes an organic material, the alkali metal, the alkaline earth metal, the rare earth metal, the alkali metal compound, the alkaline earth metal compound, the rare earth metal compound, the alkali metal complex, the alkaline earth metal complex, the rare earth metal complex, or a combination thereof may be homogeneously or non-homogeneously dispersed in a matrix including the organic material.

In particular, the electron injection layer may include a rare earth metal, but embodiments are not limited thereto. In some embodiments, the electron injection layer may include ytterbium (Yb), but embodiments are not limited thereto. As a rare earth metal like Yb has a relatively quite low work function, electron injection from the cathode 120 may be very quick.

The thickness of the electron injection layer may be in a range of about 1 Å to about 100 Å, and in some embodiments, about 3 Å to about 90 Å. When the thickness of the electron injection layer is within any of these ranges, excellent electron injection characteristics may be obtained without a substantial increase in driving voltage.

The cathode 120 may be on the organic layer 130. A material for forming the cathode 120 may be a material with a low work function, such as a metal, an alloy, an electrically conductive compound, and a combination thereof.

The cathode 120 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but embodiments are not limited thereto. In some embodiments, the cathode 120 may include magnesium-silver (Mg—Ag), but embodiments are not limited thereto.

The cathode 120 may be a transmissive electrode, a semi-transmissive electrode, or a reflective electrode.

The cathode 120 may have a single-layered structure, or a multi-layered structure including two or more layers.

In some embodiments, the organic layer 130 may include a hole transport layer between the anode 110 and the first exciton quenching layer 132, wherein the first exciton quenching layer 132 may be in direct contact with the hole transport layer. In this embodiment, the first exciton quenching layer 132 may include a first base material, and the highest occupied molecular orbital (HOMO) level of the first base material may be lower than the HOMO level of the host. Accordingly, the first exciton quenching layer 132 may serve as a hole blocking layer at the same time.

According to one or more embodiments, the hole transport layer may include a hole transporting material, and the first base material may be identical to the hole transporting material, but embodiments are not limited thereto.

According to one or more embodiments, the organic layer 130 may include: a hole transport layer between the anode 110 and the first exciton quenching layer 132; and an electron blocking layer between the hole transport layer and the first exciton quenching layer 132, wherein the first exciton quenching layer 132 may be in direct contact with the electron blocking layer, and the electron blocking layer may be in direct contact with the hole transport layer.

According to one or more embodiments, the hole transport layer may include a hole transporting material, the electron blocking layer may include an electron blocking material, and the first base material may be identical to the hole transporting material and/or the electron blocking material, but embodiments are not limited thereto.

In FIG. 1, a substrate may be additionally disposed under (a surface not in contact with the organic layer) the anode 110 or on (a surface not in contact with the organic layer) the cathode 120. The substrate may be a glass substrate or a plastic substrate, each having excellent mechanical strength, thermal stability, transparency, surface smoothness, ease of handling, and water resistance.

When the organic light-emitting device 1 is a full color organic light-emitting device, the emission layer 131 may be patterned into a red emission layer, a green emission layer, or a blue emission layer, according to a sub-pixel. In one or more embodiments, the emission layer 131 may have a stacked structure. The stacked structure may include two or more layers selected from a red emission layer, a green emission layer, and a blue emission layer. The two or more layers may be in direct contact with each other. In some embodiments, the two or more layers may be separated from each other. In one or more embodiments, the emission layer may include two or more materials. The two or more materials may include a red light-emitting material, a green light-emitting material, or a blue light-emitting material. The two or more materials may be mixed with each other in a single layer. The two or more materials mixed with each other in the single layer may emit white light.

Figure 2:
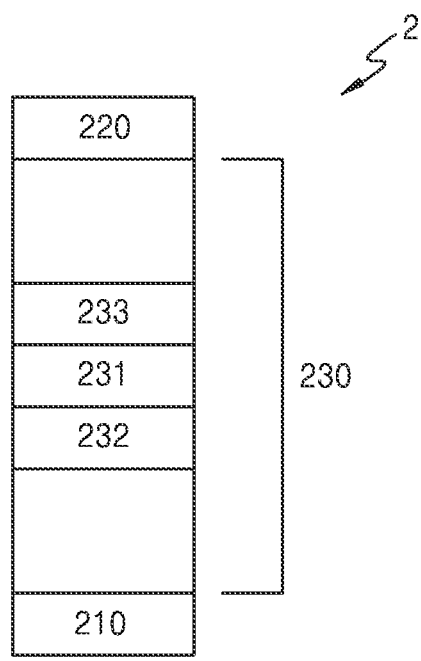
FIG. 2 illustrates a schematic cross-sectional view of an embodiment of an organic light-emitting device.

FIG. 2 is a schematic view of an organic light-emitting device 2 according to another embodiment. Referring to FIG. 2, the structure of the organic light-emitting device 2 according to another embodiment will be described in detail, focusing on the difference with the organic light-emitting device 1.

As shown in FIG. 2, the organic light-emitting device 2 may include an anode 210; a cathode 220; an organic layer 230 between the anode 210 and the cathode 220 and including an emission layer 231; a first exciton quenching layer 232 between the anode 210 and the emission layer 231 and in direct contact with the emission layer 231; and a second exciton quenching layer 233 between the cathode 220 and the emission layer 231 and in direct contact with the emission layer 231, wherein the emission layer 231 may include a host and a dopant, the first exciton quenching layer 232 may include a first quenching material, the second exciton quenching layer may include a second quenching material, and the host, the dopant, and the first and second quenching materials may each satisfy Equations 1-1, 1-2, 2-1, and 2-2:

$$T1(Q1) \leq T1(H) \quad \text{Equation 1-1}$$

$$T1(Q1) \leq T1(D) \quad \text{Equation 1-2}$$

$$T1(Q2) \leq T1(H) \quad \text{Equation 2-1}$$

$$T1(Q2) \leq T1(D) \quad \text{Equation 2-2}$$

wherein, in Equations 1-1, 1-2, 2-1, and 2-2,

T1(Q1) indicates a lowest excited triplet energy level of the first quenching material, T1(Q2) indicates a lowest excited triplet energy level of the second quenching material, T1(H) indicates a lowest excited triplet energy level of the host, and T1(D) indicates a lowest excited triplet energy level of the dopant.

In the organic light-emitting device that satisfies Equation 2-1, some of triplets generated from the host in the emission layer may be transferred to the second exciton quenching layer. Accordingly, the triplet concentration in the emission layer may be properly controlled, and the lifespan of the organic light-emitting device may be improved by lowering the concentration of triplets present in the emission layer and not participating in emission.

In the organic light-emitting device that satisfies Equation 2-2, all triplets generated from the host in the emission layer do not move to the first exciton quenching layer (e.g., not all triplets generated from the host in the emission layer move to the second exciton quenching layer), and triplets may also move to the dopant in the emission layer. Accordingly, the triplet concentration in the emission layer may be maintained to an extent that the desired luminescence efficiency may be obtained.

In particular, the host, the dopant, and the second quenching material may further satisfy Equation 2-11 and/or 2-21, but embodiments are not limited thereto:

$$0.01 \text{ eV} \leq T1(H) - T1(Q2) \leq 2.0 \text{ eV} \quad \text{Equation 2-11}$$

$$0.02 \text{ eV} \leq T1(D) - T1(Q2) \leq 2.0 \text{ Ev} \quad \text{Equation 2-21}$$

wherein, in Equations 2-11 and 2-21,

T1(Q2) indicates a lowest excited triplet energy level of the second quenching material, T1(H) indicates a lowest excited triplet energy level of the host, and T1(D) indicates a lowest excited triplet energy level of the dopant.

In the organic light-emitting device that further satisfies Equation 2-11, as the ratio of triplets that move from the host to the second exciton quenching layer to triplets that move from the host to the dopant is properly controlled, efficiency and lifespan thereof may be improved simultaneously.

In the organic light-emitting device that further satisfies Equation 2-21, as the ratio of triplets that move from the host to the dopant is properly controlled, efficiency thereof may be further improved.

For example, the first quenching material may be identical to the second quenching material, but embodiments are not limited thereto.

The second quenching material may satisfy 1.0 eV≤T1(Q2)≤2.5 eV, but embodiments are not limited thereto. When the second quenching material satisfies the range described above, excitons that may deteriorate lifespan by being excessively accumulated in the emission layer may be sufficiently dispersed to the second exciton quenching layer.

The second quenching material may be represented by Formula 3, but embodiments are not limited thereto:

In some embodiments, the second quenching material may be selected from Compounds Q1 to Q36, but embodiments are not limited thereto.

The content of the second quenching material in the second exciton quenching layer 233 may be in a range of about 0.01 wt % to about 20 wt %, but embodiments are not limited thereto. When the content is within this range, a sufficient amount of triplets may move from the host to the second exciton quenching layer 233 to a degree for improving lifespan of the organic light-emitting device.

The second exciton quenching layer 233 may further include a second base material, but embodiments are not limited thereto. The second base material may improve electron transportation of the second exciton quenching layer 233.

In some embodiments the second base material may be identical to the host, but embodiments are not limited thereto. In some embodiments, the second base material may be identical to an electron transporting host, but embodiments are not limited thereto.

The second exciton quenching layer 233 may consist of a second quenching material and the second base material, but embodiments are not limited thereto.

When the second exciton quenching layer 233 further includes the second base material, the content of the second base material in the first exciton quenching layer 233 may be in a range of about 99.99 wt % to about 80 wt %, but embodiments are not limited thereto. When the content is within this range, electron transportation in the second exciton quenching layer 233 may be sufficiently improved, thus lowering the driving voltage of the organic light-emitting device.

In some embodiments, the second base material may satisfy T1(B2)≤T1(H), wherein T1(B2) indicates the lowest excited triplet energy level of the second base material. The second base material may satisfy T1(B2)≤T1(D).

In some embodiments, the second base material may satisfy 1.0 eV≤T1(B2)≤2.5 eV, but embodiments are not limited thereto. When the second base material satisfies the range described above, excitons that may deteriorate lifespan by being excessively accumulated in the emission layer may be sufficiently dispersed to the second exciton quenching layer.

In some embodiments, a thickness of the emission layer 231 ($D_E$) and a thickness of the second exciton quenching layer 233 ($D_{Q2}$) satisfy $D_E \geq D_{Q2}$. In some embodiments, $D_E$ and $D_{Q2}$ may satisfy $D_E > D_{Q2}$, but embodiments are not limited thereto. When this range is satisfied, the organic light-emitting device may have improved lifespan while not increasing the driving voltage.

In some embodiments, a thickness of the second exciton quenching layer 233 may be in a range of about 50 Å to about 200 Å, but embodiments are not limited thereto. When this range is satisfied, the organic light-emitting device may have improved lifespan while not substantially increasing the driving voltage.

In some embodiments, the organic layer 230 may include an electron transport layer between the cathode 220 and the second exciton quenching layer 233, wherein the second exciton quenching layer 233 may be in direct contact with the electron transport layer. In this embodiment, the second exciton quenching layer 233 may include a second base material, and the lowest unoccupied molecular orbital (LUMO) level of the second base material may be lower than the LUMO level of the host. Accordingly, the second exciton quenching layer 233 may serve as an electron blocking layer at the same time.

According to one or more embodiments, the electron transport layer may include an electron transporting material, and the second base material may be identical to the electron transporting material, but embodiments are not limited thereto.

According to one or more embodiments, the organic layer 230 may include: an electron transport layer between the cathode 220 and the second exciton quenching layer 233; and a hole blocking layer between the electron transport layer and the second exciton quenching layer 233, wherein the second exciton quenching layer 233 may be in direct contact with the hole blocking layer, and the hole blocking layer may be in direct contact with the electron transport layer.

According to one or more embodiments, the electron transport layer may include an electron transporting material, the hole blocking layer may include a hole blocking material, and the second base material may be identical to the electron transporting material and/or the hole blocking material, but embodiments are not limited thereto.

In FIG. 2, the anode 210, the cathode 220, and the organic layer 230 may be understood by referring to the descriptions thereof in FIG. 1.

The organic light-emitting device 1 and the organic light-emitting device 2 may further include a capping layer in a direction to which light is passed. The capping layer may improve the external luminescence efficiency based on the principle of constructive interference.

The capping layer may be a capping layer consisting of an organic material, an inorganic capping layer consisting of an inorganic material, or a composite capping layer including an organic material and an inorganic material.

The capping layer may include at least one material selected from carbocyclic compounds, heterocyclic compounds, amine-based compounds, porphine derivatives, phthalocyanine derivatives, naphthalocyanine derivatives, alkali metal complexes, and alkaline earth metal complexes. The carbocyclic compound, the heterocyclic compound, and the amine group-containing compound may optionally be substituted with a substituent containing at least one element selected from O, N, S, Se, Si, F, Cl, Br, and I.

In some embodiments, the capping layer may include at least one amine-based compound.

In some embodiments, the capping layer may include the compound represented by Formula 201 or the compound represented by Formula 202.

In some embodiments, the capping layer may include a compound selected from Compounds HT28 to HT33 and Compounds CP1 to CP5, but embodiments are not limited thereto:

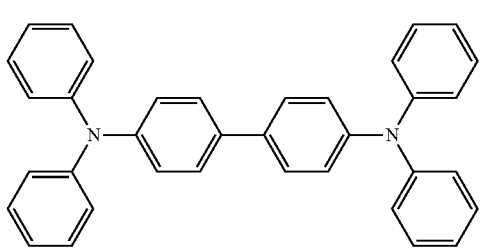

CP1

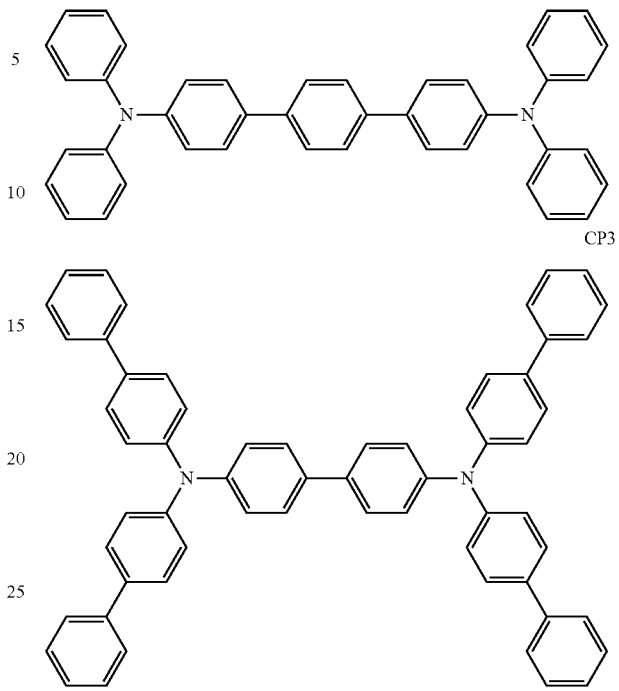

CP2

CP3

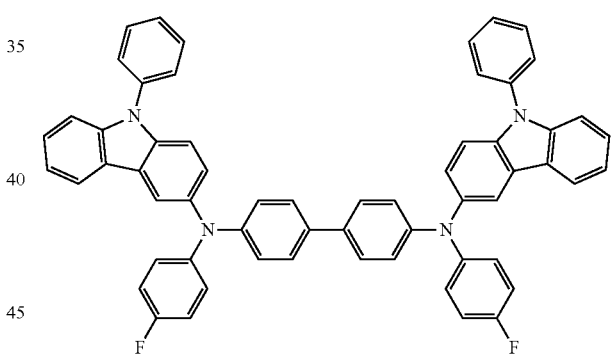

CP4

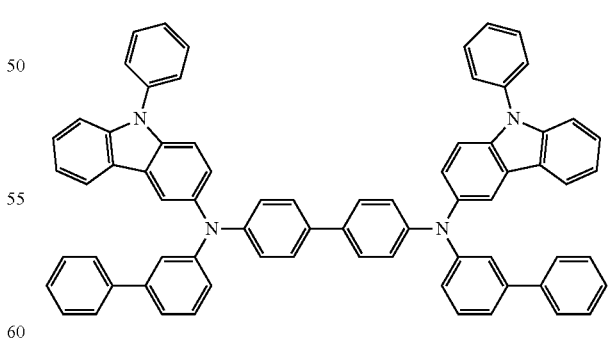

CP5

Hereinbefore, the organic light-emitting device has been described with reference to FIGS. 1 and 2, but embodiments are not limited thereto.

The layers constituting the hole transport region, the emission layer, and the layers constituting the electron transport region may be formed in a specific region by using one or more suitable methods such as vacuum deposition, spin coating, casting, Langmuir-Blodgett (LB) deposition, ink-jet printing, laser printing, and laser-induced thermal imaging.

When the layers constituting the hole transport region, the emission layer, and the layers constituting the electron transport region are each formed by vacuum deposition, the vacuum deposition may be performed at a deposition temperature in a range of about 100° C. to about 500° C. at a vacuum degree in a range of about $10^{-8}$ torr to about $10^{-3}$ torr, and at a deposition rate in a range of about 0.01 Angstroms per second (Å/sec) to about 100 Å/sec, depending on the material to be included in each layer and the structure of each layer to be formed.

When the layers constituting the hole transport region, the emission layer, and the layers constituting the electron transport region are each formed by spin coating, the spin coating may be performed at a coating rate of about 2,000 revolutions per minute (rpm) to about 5,000 rpm and at a heat treatment temperature of about 80° C. to about 200° C., depending on the material to be included in each layer and the structure of each layer to be formed.

The term "$C_1$-$C_{60}$ alkyl group" as used herein refers to a linear or branched aliphatic hydrocarbon monovalent group having 1 to 60 carbon atoms. Examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein Ani is a $C_1$-$C_{60}$ alkyl group). Examples thereof include a methoxy group, an ethoxy group, and an isopropyloxy group.

The term "$C_3$-$C_{10}$ cycloalkyl group" as used herein refers to a monovalent saturated hydrocarbon monocyclic group including 3 to 10 carbon atoms. Examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent monocyclic group including at least one heteroatom selected from N, O, Si, P, and S as a ring-forming atom and 1 to 10 carbon atoms. Examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one double bond in its ring, and is not aromatic. Examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group including at least one heteroatom selected from N, O, Si, P, and S as a ring-forming atom, 1 to 10 carbon atoms, and at least one double bond in its ring. Examples of the $C_1$-$C_{10}$ heterocycloalkenyl group include a 4,5-dihydro-1,2,3,4-oxatriazolyl-group, a 2,3-dihydrofuranyl group, and a 2,3-dihydrothiophenyl group. The term "$C_1$-$C_{10}$ heterocycloalkylene group" as used herein refers to a divalent group having the same structure as the $C_1$-$C_{10}$ heterocycloalkyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each independently include two or more rings, the respective rings may be fused.

The term "$C_1$-$C_{60}$ heteroaryl group" as used herein refers to a monovalent group having a heterocyclic aromatic system having at least one heteroatom selected from N, O, Si, P, and S as a ring-forming atom and 1 to 60 carbon atoms. The term "$C_1$-$C_{60}$ heteroarylene group" as used herein refers to a divalent group having a heterocyclic aromatic system having at least one heteroatom selected from N, O, Si, P, and S as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each independently include two or more rings, the respective rings may be fused.

The term "$C_6$-$C_{60}$ aryloxy group" as used herein is represented by —$OA_{102}$ (wherein $A_{102}$ is the $C_6$-$C_{60}$ aryl group). The term "$C_6$-$C_{60}$ arylthio group" as used herein is represented by —$SA_{103}$ (wherein $A_{103}$ is the $C_6$-$C_{60}$ aryl group).

The term "$C_1$-$C_{60}$ heteroaryloxy group" as used herein indicates —$OA_{104}$ (wherein $A_{104}$ is a $C_1$-$C_{60}$ heteroaryl group). The term "$C_1$-$C_{60}$ heteroarylthio group" as used herein indicates —$SA_{105}$ (wherein $A_{105}$ is a $C_1$-$C_{60}$ heteroaryl group).

The term "monovalent non-aromatic condensed polycyclic group" as used herein refers to a monovalent group that has two or more rings condensed and only carbon atoms as ring forming atoms (e.g., 8 to 60 carbon atoms), wherein the entire molecular structure is non-aromatic. Examples of the monovalent non-aromatic condensed polycyclic group may include a fluorenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and at least one heteroatom selected from N, O, Si, P, and S, in addition to carbon atoms (e.g., 1 to 60 carbon atoms), as a ring-forming atom, wherein the entire molecular structure is non-aromatic. Examples of the monovalent non-aromatic condensed heteropolycyclic group may include a carbazolyl group. The term "divalent non-aromatic condensed heteropolycyclic group" as used herein refers to a divalent group having substantially the same structure as the monovalent non-aromatic condensed heteropolycyclic group.

The term "$C_5$-$C_{60}$ carbocyclic group" as used herein refers to a monocyclic or polycyclic group having 5 to 60 carbon atoms only as ring-forming atoms. The $C_5$-$C_{60}$ carbocyclic group may be an aromatic carbocyclic group or a non-aromatic carbocyclic group. The term "$C_5$-$C_{60}$ carbocyclic group" as used herein refers to a ring (e.g., a benzene group), a monovalent group (e.g., a phenyl group), or a divalent group (e.g., a phenylene group). Also, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group" as used herein refers to a group having substantially the same structure as the $C_5$-$C_{60}$ carbocyclic group, except that at least one heteroatom selected from N, O, Si, P, and S is used as a ring-forming atom, in addition to carbon atoms (e.g., 1 to 60 carbon atoms).

In the present specification, at least one substituent of the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be selected from:

deuterium (-D), —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group.

The term "Ph" as used herein refers to a phenyl group. The term "Me" as used herein refers to a methyl group. The term "Et" as used herein refers to an ethyl group. The term "ter-Bu" or "But" as used herein refers to a tert-butyl group. The term "OMe" as used herein refers to a methoxy group.

The term "biphenyl group" as used herein refers to a phenyl group substituted with a phenyl group. The "biphenyl group" may be a substituted phenyl group having a $C_6$-$C_{60}$ aryl group as a substituent.

The term "terphenyl group" as used herein refers to a phenyl group substituted with a biphenyl group. The "terphenyl group" may be a substituted phenyl group having a $C_6$-$C_{60}$ aryl group substituted with a $C_6$-$C_{60}$ aryl group as a substituent.

The symbols * and *' as used herein, unless defined otherwise, refer to a binding site to an adjacent atom in a corresponding formula.

Hereinafter an organic light-emitting device according to an embodiment will be described in detail with reference to Examples.

EXAMPLES
Evaluation Example 1: Measurement of Lowest Excited Triplet Energy Level (T1)
T1 energy level of each of compounds used in Examples 1 and 2 and Comparative Examples 1 to 3 was measured, and the results thereof are shown in Table 1.
TABLE 1
| Compound name | T1 energy level (eV) | Compound name | T1 energy level (eV) |
|---|---|---|---|
| CBP | 2.7 | Compound HT7 | 2.4 |
| Compound T1 | 2.6 | Compound 1 | 2.8 |
| Compound Q28 | 2.1 | Compound ET2 | 2.4 |
CBP
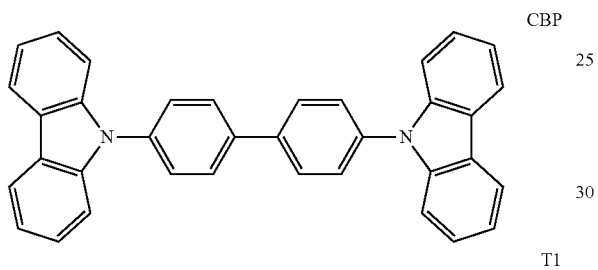
T1
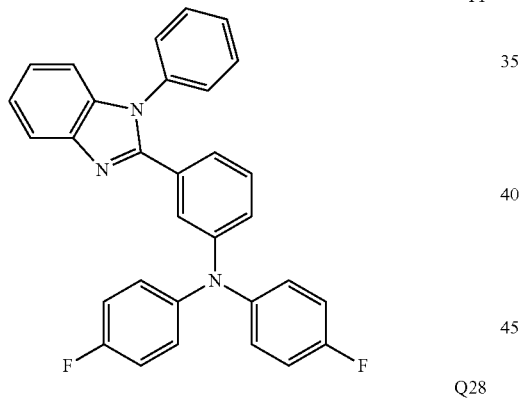
Q28
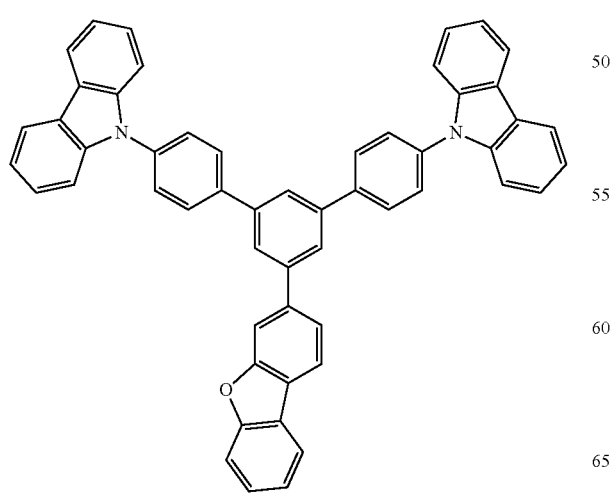
HT7
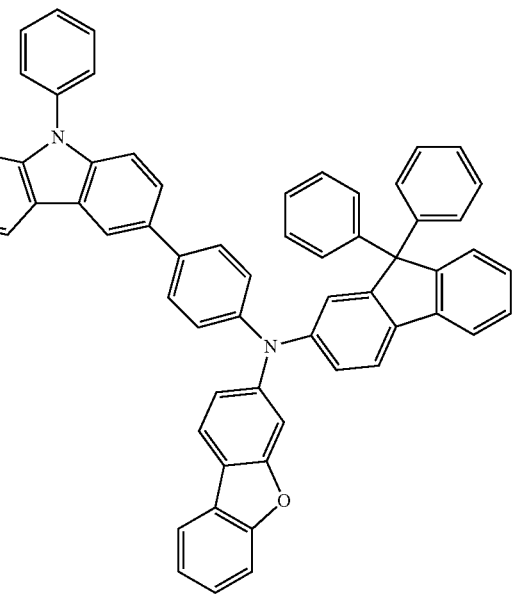
1
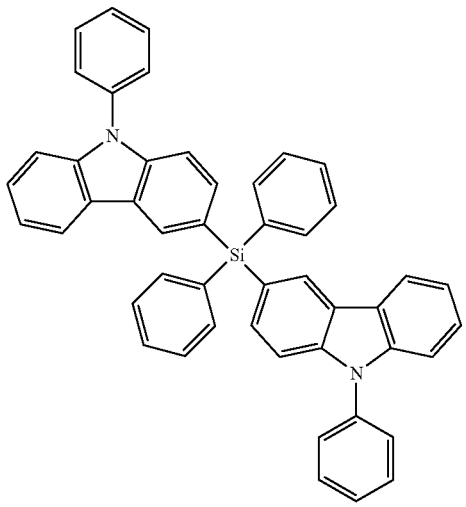

-continued

ET2

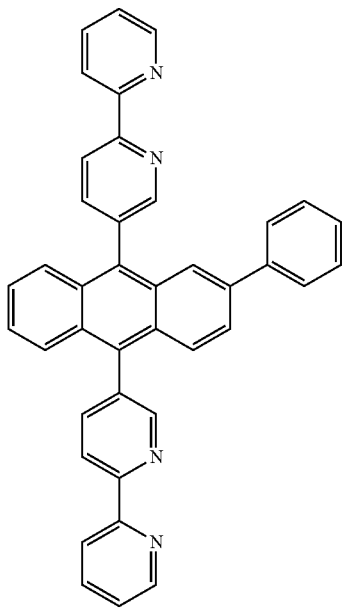

Example 1

An anode was manufactured by cutting a Corning 15 Ω/cm² (1,200 Å) ITO glass substrate to a size of 50 mm×50 mm×0.7 mm, ultrasonically cleaning the glass substrate by using isopropyl alcohol and pure water for 5 minutes each, and then irradiating UV light for 30 minutes thereto and being exposed to ozone to clean. Then, the anode was loaded into a vacuum deposition apparatus.

2-TNATA was vacuum-deposited on the glass substrate to a thickness of 600 Å to form a hole injection layer. Then, HAT-CN was vacuum-deposited thereon to a thickness of 300 Å to form a hole transport layer.

Compounds Q28 and HT7 were co-vacuum-deposited on the hole transport layer at a weight ratio of 5:95 to form an exciton quenching layer having a thickness of 10 Å.

CBP (as a host) and Compound T1 (as a dopant) were co-deposited on the exciton quenching layer at a weight ratio of 95:5 to form an emission layer having a thickness of 290 Å.

Thereafter, ET1 was vacuum-deposited on the emission layer to form an electron transport layer having a thickness of 300 Å. Yb was vacuum-deposited on the electron transport layer to a thickness of 10 Å to form an electron injection layer, and subsequently, Al was vacuum-deposited thereon to a thickness of 3,000 Å (cathode), thereby completing the manufacture of an organic light-emitting device.

Example 2

An organic light-emitting device was manufactured in substantially the same manner as in Example 1, except that the thickness of the exciton quenching layer was 30 Å.

Comparative Example 1

An anode was manufactured by cutting a Corning 15 Ω/cm² (1,200 Å) ITO glass substrate to a size of 50 mm×50 mm×0.7 mm, ultrasonically cleaning the glass substrate by using isopropyl alcohol and pure water for 5 minutes each, and then irradiating UV light for 30 minutes thereto and being exposed to ozone to clean. Then, the anode was loaded into a vacuum deposition apparatus.

2-TNATA was vacuum-deposited on the glass substrate to a thickness of 600 Å to form a hole injection layer. Then, HAT-CN was vacuum-deposited thereon to a thickness of 300 Å to form a hole transport layer.

CBP (as a host) and Compound T1 (as a dopant) were co-deposited on the hole transport layer at a weight ratio of 95:5 to form an emission layer having a thickness of 290 Å.

Compounds Q28 and ET2 were vacuum-deposited on the emission layer at a weight ratio of 5:95 to form an exciton quenching layer having a thickness of 10 Å.

Thereafter, ET1 was vacuum-deposited on the exciton quenching layer to form an electron transport layer having a thickness of 300 Å. Yb was vacuum-deposited on the electron transport layer to a thickness of 10 Å to form an electron injection layer, and subsequently, Al was vacuum-deposited thereon to a thickness of 3,000 Å (cathode), thereby completing the manufacture of an organic light-emitting device.

Comparative Example 2

An organic light-emitting device was manufactured in substantially the same manner as in Example 1, except that materials shown in Table 2 were used.

Comparative Example 3

An organic light-emitting device was manufactured in substantially the same manner as in Example 1, except that materials shown in Table 2 were used, and the thickness of the exciton quenching layer was 30 Å.

Evaluation Example 2

The driving voltages (V) and lifespans ($LT_{50}$) of the organic light-emitting devices manufactured in Examples 1 and 2 and Comparative Examples 1 to 3 were measured by using Keithley source-measure unit (SMU) 236 and a luminance meter PR650. The results thereof are shown in Table 2.

TABLE 2

| | Emission layer | | Exciton quenching layer | | Driving voltage (V) | $LT_{50}$ (hours) |
| | Dopant | Host | Quenching material | Base material | | |
|---|---|---|---|---|---|---|
| Example 1 | Compound T1 | CBP | Compound Q28 | Compound HT7 | 3.8 | 150 |
| Example 2 | Compound T1 | CBP | Compound Q28 | Compound HT7 | 4.1 | 194 |
| Comparative Example 1 | Compound T1 | CBP | Compound Q28 | Compound ET2 | 3.8 | 45 |
| Comparative Example 2 | Compound T1 | CBP | CBP | Compound 1 | 3.7 | 45 |
| Comparative Example 3 | Compound T1 | CBP | CBP | Compound 1 | 4.0 | 48 |

Referring to the results of Table 1, it was found that the organic light-emitting device of Examples 1 and 2 have long lifespan, as compared with the organic light-emitting devices of Comparative Examples 1 to 3.

The invention claimed is:
1. An organic light-emitting device comprising:
an anode;
a cathode;
an organic layer between the anode and the cathode and comprising an emission layer; and
a first exciton quenching layer between the anode and the emission layer and in direct contact with the emission layer,
wherein the emission layer comprises a host and a dopant,
the first exciton quenching layer comprises a first quenching material, and
the host, the dopant, and the first quenching material satisfy Equations 1-1 and 1-2:

$$T1(Q1) \leq T1(H) \quad \text{Equation 1-1}$$

$$T1(Q1) \leq T1(D), \text{ and} \quad \text{Equation 1-2}$$

wherein, in Equations 1-1 and 1-2,
$T1(Q1)$ indicates a lowest excited triplet energy level of the first quenching material,
$T1(H)$ indicates a lowest excited triplet energy level of the host, and
$T1(D)$ indicates a lowest excited triplet energy level of the dopant,
wherein the first quenching material is represented by Formula 3:

Formula 3

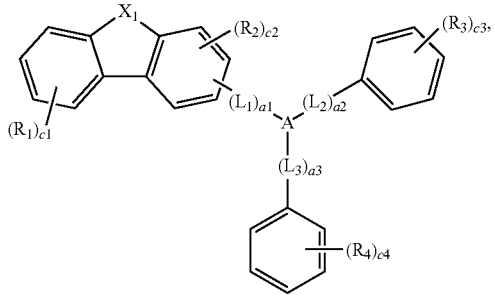

wherein, in Formula 3,
$X_1$ is $N\text{-}(L_4)_{a4}\text{-}(Ar_1)_{b1}$, O, or S,
A is a substituted or unsubstituted $C_6\text{-}C_{20}$ aromatic ring,
$R_1$ to $R_4$ are each independently a group represented by Formula 10, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1\text{-}C_{60}$ alkyl group, a substituted or unsubstituted $C_2\text{-}C_{60}$ alkenyl group, a substituted or unsubstituted $C_2\text{-}C_{60}$ alkynyl group, a substituted or unsubstituted $C_1\text{-}C_{60}$ alkoxy group, a substituted or unsubstituted $C_3\text{-}C_{10}$ cycloalkyl group, a substituted or unsubstituted $C_2\text{-}C_{10}$ heterocycloalkyl group, a substituted or unsubstituted $C_3\text{-}C_{10}$ cycloalkenyl group, a substituted or unsubstituted $C_2\text{-}C_{10}$ heterocycloalkenyl group, a substituted or unsubstituted $C_6\text{-}C_{60}$ aryl group, a substituted or unsubstituted $C_6\text{-}C_{60}$ aryloxy group, a substituted or unsubstituted $C_6\text{-}C_{60}$ arylthio group, a substituted or unsubstituted $C_1\text{-}C_{60}$ heteroaryl group, a substituted or unsubstituted monovalent non-aromatic condensed polycyclic group, a substituted or unsubstituted monovalent non-aromatic condensed heteropolycyclic group, —Si(Q$_1$)(Q$_2$)(Q$_3$), or —B(Q$_1$)(Q$_2$), Formula 10

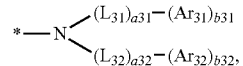

and
wherein, in Formulae 3 and 10,
$L_1$ to $L_4$, $L_{31}$ and $L_{32}$ are each independently a substituted or unsubstituted $C_3\text{-}C_{10}$ cycloalkylene group, a substituted or unsubstituted $C_1\text{-}C_{10}$ heterocycloalkylene group, a substituted or unsubstituted $C_3\text{-}C_{10}$ cycloalkenylene group, a substituted or unsubstituted $C_1\text{-}C_{10}$ heterocycloalkenylene group, a substituted or unsubstituted $C_6\text{-}C_{60}$ arylene group, a substituted or unsubstituted $C_1\text{-}C_{60}$ heteroarylene group, a substituted or unsubstituted divalent non-aromatic condensed polycyclic group, or a substituted or unsubstituted divalent non-aromatic condensed heteropolycyclic group,
a1 to a4 and a31 to a32 are each independently 0, 1, 2, or 3,
$Ar_1$, $Ar_{31}$ and $Ar_{32}$ are each independently a substituted or unsubstituted $C_3\text{-}C_{10}$ cycloalkyl group, a substituted or unsubstituted $C_1\text{-}C_{10}$ heterocycloalkyl group, a substituted or unsubstituted $C_3\text{-}C_{10}$ cycloalkenyl group, a substituted or unsubstituted $C_1\text{-}C_{10}$ heterocycloalkenyl group, a substituted or unsubstituted $C_6\text{-}C_{60}$ aryl group, a substituted or unsubstituted $C_1\text{-}C_{60}$ heteroaryl group, a substituted or unsubstituted monovalent non-aromatic condensed polycyclic group, or a substituted or unsubstituted monovalent non-aromatic condensed heteropolycyclic group,
b1, b31, and b32 are each independently 1, 2, 3, 4, or 5,
$Ar_{31}$ and $Ar_{32}$ are optionally bound to each other to form a saturated or unsaturated ring,
c1 is 1, 2, 3, or 4, c2 is 1, 2, or 3, and c3 and c4 are each independently 1, 2, 3, 4, or 5, and
when c1 is 2 or greater, two of $R_1$(s) are optionally bound to form a saturated or unsaturated ring, when c2 is 2 or greater, two of $R_2$(s) are optionally bound to form a saturated or unsaturated ring, when c3 is 2 or greater, two of $R_3$(s) are optionally bound to form a saturated or unsaturated ring, and when c4 is 2 or greater, two of $R_4$(s) are optionally bound to form a saturated or unsaturated ring, and
$Q_1$ to $Q_3$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1\text{-}C_{60}$ alkyl group, a $C_2\text{-}C_{60}$ alkenyl group, a $C_2\text{-}C_{60}$ alkynyl group, a $C_1\text{-}C_{60}$ alkoxy group, a $C_3\text{-}C_{10}$ cycloalkyl group, a $C_1\text{-}C_{10}$ heterocycloalkyl group, a $C_3\text{-}C_{10}$ cycloalkenyl group, a $C_1\text{-}C_{10}$ heterocycloalkenyl group, a $C_6\text{-}C_{60}$ aryl group, a $C_1\text{-}C_{60}$ heteroaryl group, a monovalent non-aromatic condensed polycyclic group, or a monovalent non-aromatic condensed heteropolycyclic group.

2. The organic light-emitting device of claim 1, wherein the first exciton quenching layer further comprises a first base material.

3. The organic light-emitting device of claim 1, wherein a thickness of the emission layer ($D_E$) and a thickness of the first exciton quenching layer ($D_{Q1}$) satisfy $D_E \geq D_{Q1}$.

4. The organic light-emitting device of claim 1, wherein the dopant is to emit delayed fluorescence or fluorescence.

5. The organic light-emitting device of claim 1, wherein the host comprises a first host and a second host.

6. The organic light-emitting device of claim 5, wherein the first host is a hole transporting host not comprising an electron transporting moiety, and the second host is an electron transporting host comprising an electron transporting moiety.

7. The organic light-emitting device of claim 1, further comprising an electron injection layer between the emission layer and the cathode, wherein a work function of the electron injection layer is less than 3.0 electron volts (eV).

8. The organic light-emitting device of claim 7, wherein the electron injection layer comprises a rare earth metal.

9. The organic light-emitting device of claim 7, wherein the electron injection layer comprises ytterbium (Yb).

10. The organic light-emitting device of claim 1, wherein
the organic layer further comprises a hole transport layer between the anode and the first exciton quenching layer, and
wherein the first exciton quenching layer is in direct contact with the hole transport layer.

11. An organic light-emitting device comprising:
an anode;
a cathode;
an organic layer between the anode and the cathode and comprising an emission layer; and
a first exciton quenching layer between the anode and the emission layer and in direct contact with the emission layer,
wherein the emission layer comprises a host and a dopant,
the first exciton quenching layer comprises a first quenching material, and
the host, the dopant, and the first quenching material satisfy Equations 1-1 and 1-2:

$$T1(Q1) \leq T1(H) \qquad \text{Equation 1-1}$$

$$T1(Q1) \leq T1(D), \qquad \text{Equation 1-2}$$

wherein, in Equations 1-1 and 1-2,
T1(Q1) indicates a lowest excited triplet energy level of the first quenching material,
T1(H) indicates a lowest excited triplet energy level of the host, and
T1(D) indicates a lowest excited triplet energy level of the dopant, and
wherein:
the organic layer further comprises a hole transport layer between the anode and the first exciton quenching layer,
the first exciton quenching layer is in direct contact with the hole transport layer,
the hole transport layer comprises a hole transporting material,
the first exciton quenching layer further comprises a first base material, and
the first base material is identical to the hole transporting material.

12. An organic light-emitting device comprising:
an anode;
a cathode;
an organic layer between the anode and the cathode and comprising an emission layer; and
a first exciton quenching layer between the anode and the emission layer and in direct contact with the emission layer,
wherein the emission layer comprises a host and a dopant,
the first exciton quenching layer comprises a first quenching material, and
the host, the dopant, and the first quenching material satisfy Equations 1-1 and 1-2:

$$T1(Q1) \leq T1(H) \qquad \text{Equation 1-1}$$

$$T1(Q1) \leq T1(D), \qquad \text{Equation 1-2}$$

wherein, in Equations 1-1 and 1-2,
T1(Q1) indicates a lowest excited triplet energy level of the first quenching material,
T1(H) indicates a lowest excited triplet energy level of the host, and
T1(D) indicates a lowest excited triplet energy level of the dopant,
wherein the organic layer comprises: a hole transport layer between the anode and the first exciton quenching layer; and
an electron blocking layer between the hole transport layer and the first exciton quenching layer, and
wherein the first exciton quenching layer is in direct contact with the electron blocking layer, and
the electron blocking layer is in direct contact with the hole transport layer.

13. The organic light-emitting device of claim 12, wherein
the hole transport layer comprises a hole transporting material,
the electron blocking layer comprises an electron blocking material,
the first exciton quenching layer further comprises a first base material, and
the first base material is identical to the hole transporting material and/or the electron blocking material.

14. The organic light-emitting device of claim 1, further comprising:
a second exciton quenching layer between the cathode and the emission layer and in direct contact with the emission layer,
the second exciton quenching layer comprises a second quenching material, and
the host, the dopant, and the second quenching material satisfy Equations 2-1 and 2-2:

$$T1(Q2) \leq T1(H) \qquad \text{Equation 2-1}$$

$$T1(Q2) \leq T1(D) \qquad \text{Equation 2-2}$$

wherein, in Equations 2-1 and 2-2,
T1(Q2) indicates a lowest excited triplet energy level of the second quenching material,
T1(H) indicates a lowest excited triplet energy level of the host, and
T1(D) indicates a lowest excited triplet energy level of the dopant.

15. The organic light-emitting device of claim 14, wherein the second exciton quenching layer further comprises a second base material.

16. The organic light-emitting device of claim 14, wherein a thickness of the emission layer($D_E$) and a thickness of the second exciton quenching layer($D_{Q2}$) satisfy $D_E \geq D_{Q2}$.

17. The organic light-emitting device of claim 14, wherein the organic layer comprises an electron transport layer between the cathode and the second exciton quenching layer, and the second exciton quenching layer is in direct contact with the electron transport layer.

18. The organic light-emitting device of claim 17, wherein the electron transport layer comprises an electron transporting material,
the second exciton quenching layer further comprises a second base material, and
the second base material is identical to the electron transporting material.

19. The organic light-emitting device of claim 14, wherein the organic layer further comprises: an electron transport layer between the cathode and the second exciton quenching layer; and
a hole blocking layer between the electron transport layer and the second exciton quenching layer, and
wherein the second exciton quenching layer is in direct contact with the hole blocking layer, and
the hole blocking layer is in direct contact with the electron transport layer.

20. The organic light-emitting device of claim 19, wherein the electron transport layer comprises an electron transporting material,
the hole blocking layer comprises a hole blocking material,
the second exciton quenching layer further comprises a second base material, and
the second base material is identical to the electron transporting material and/or the hole blocking material.

* * * * *